US012641907B2

(12) United States Patent
Matsumoto et al.

(10) Patent No.: US 12,641,907 B2
(45) Date of Patent: May 26, 2026

(54) IMAGING ELEMENT AND IMAGING DEVICE WITH MULTIPLE SUBSTRATES

(71) Applicant: NIKON CORPORATION, Tokyo (JP)

(72) Inventors: Shigeru Matsumoto, Sagamihara (JP); Shutaro Kato, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 22 days.

(21) Appl. No.: 18/685,796

(22) PCT Filed: Aug. 22, 2022

(86) PCT No.: PCT/JP2022/031529
§ 371 (c)(1),
(2) Date: Feb. 22, 2024

(87) PCT Pub. No.: WO2023/027011
PCT Pub. Date: Mar. 2, 2023

(65) Prior Publication Data
US 2024/0355862 A1    Oct. 24, 2024

(30) Foreign Application Priority Data
Aug. 25, 2021    (JP) ................................. 2021-137590

(51) Int. Cl.
*H10F 39/00*    (2025.01)
*H04N 25/79*    (2023.01)
(52) U.S. Cl.
CPC ........... *H10F 39/811* (2025.01); *H04N 25/79* (2023.01)
(58) Field of Classification Search
CPC ...... H10F 39/811; H10F 39/018; H10F 39/12; H10F 39/809; H04N 25/79; H04N 25/70;
(Continued)

(56) References Cited

U.S. PATENT DOCUMENTS

2005/0184398 A1*  8/2005  Zhou .................. H03K 19/1732
                                                          257/E23.079
2015/0163403 A1*  6/2015  Wakabayashi ........ H10F 39/811
                                                          348/308
(Continued)

FOREIGN PATENT DOCUMENTS

JP       2012-244331 A    12/2012
JP       2015-103998 A    6/2015
(Continued)

OTHER PUBLICATIONS

Nov. 1, 2022 International Search Report issued in International Patent Application No. PCT/JP2022/031529.
(Continued)

*Primary Examiner* — Abdelaaziz Tissire
(74) *Attorney, Agent, or Firm* — Oliff PLC

(57)       ABSTRACT

An imaging element includes: a first substrate including first, second, third pixel blocks respectively including first, second, and third pixels; a second substrate including first, second, and third signal processing blocks respectively including first, second, and third signal converters; a first signal joint configured to output the signal from the first pixel to the first signal converter and to join the first and second substrates; a second signal joint configured to output the signal from the second pixel to the second signal converter and to join the first and second substrates; and a third signal joint configured to output the signal from the third pixel to the third signal converter and to join the first and second substrates. The second pixel block is between the first and third pixel blocks. An interval between the first and second signal joints is smaller than one between the second and third signal joints.

20 Claims, 27 Drawing Sheets

400

(58) Field of Classification Search
CPC .............. H04N 5/3355; H04N 5/3745; H04N 5/37455; H04N 5/378; H03M 1/00–645
See application file for complete search history.

(56)                    References Cited

U.S. PATENT DOCUMENTS

| | | | |
|---|---|---|---|
| 2015/0288906 A1* | 10/2015 | Saito | H04N 25/617 |
| | | | 348/305 |
| 2015/0288908 A1* | 10/2015 | Shen | H04N 25/79 |
| | | | 348/308 |
| 2016/0156861 A1* | 6/2016 | Kitani | H04N 25/767 |
| | | | 348/308 |
| 2016/0344959 A1* | 11/2016 | Mabuchi | H10F 39/18 |
| 2017/0230598 A1* | 8/2017 | Takayanagi | H10F 39/158 |
| 2018/0007297 A1* | 1/2018 | Saito | H10F 39/811 |
| 2018/0227514 A1 | 8/2018 | Takahashi | |
| 2018/0337209 A1* | 11/2018 | Narui | H04N 7/183 |
| 2019/0006400 A1* | 1/2019 | Lee | H04N 7/18 |
| 2020/0059620 A1* | 2/2020 | Shimizu | H01L 21/768 |
| 2020/0273901 A1* | 8/2020 | Nakamura | H01L 24/45 |
| 2020/0389617 A1* | 12/2020 | Totsuka | H04N 25/778 |
| 2021/0175324 A1* | 6/2021 | Ogino | H10F 39/811 |
| 2021/0250533 A1* | 8/2021 | Kawazu | H04N 25/713 |
| 2021/0368121 A1* | 11/2021 | Sakurai | H04N 25/778 |
| 2022/0216246 A1* | 7/2022 | Hashiguchi | H01L 21/76829 |

FOREIGN PATENT DOCUMENTS

| | | |
|---|---|---|
| JP | 2015-122730 A | 7/2015 |
| WO | 2017/018188 A1 | 2/2017 |

OTHER PUBLICATIONS

Nov. 1, 2022 Written Opinion issued in International Patent Application No. PCT/JP2022/031529.
Oct. 29, 2024 Reasons for Refusal issued in Japanese Patent Application No. 2023-543892.
Apr. 15, 2025 Office Action issued in Japanese Patent Application No. 2023-543892.

* cited by examiner

400

400

401

402

402

403

403

404

406

408

409

IMAGING ELEMENT AND IMAGING DEVICE WITH MULTIPLE SUBSTRATES

TECHNICAL FIELD

The present invention relates to an imaging element and an imaging device. Priority is claimed on Japanese Patent Application No. 2021-137590, filed Aug. 25, 2021, the content of which is incorporated herein by reference.

BACKGROUND ART

An imaging device including a signal processing circuit that processes pixel signals from a pixel block including a plurality of pixels is known (for example, see Patent Document 1).

CITATION LIST

Patent Document

Patent Document 1

PCT International Publication No. WO2017/018188

SUMMARY OF INVENTION

An imaging element according to a first aspect of the present invention includes: a first substrate including a first pixel block including a first pixel, a second pixel block including a second pixel, and a third pixel block including a third pixel, the first pixel block, the second pixel block, and the third pixel block being arranged in a column direction; a second substrate including a first signal processing block including a first signal converter for processing a signal from the first pixel, a second signal processing block including a second signal converter for processing a signal from the second pixel, and a third signal processing block including a third signal converter for processing a signal from the third pixel; a first signal joint configured to output the signal from the first pixel to the first signal converter and to join the first substrate and the second substrate; a second signal joint configured to output the signal from the second pixel to the second signal converter and to join the first substrate and the second substrate; and a third signal joint configured to output the signal from the third pixel to the third signal converter and to join the first substrate and the second substrate, wherein the second pixel block is provided between the first pixel block and the third pixel block, and an interval between the first signal joint and the second signal joint is smaller than an interval between the second signal joint and the third signal joint.

An imaging device according to a second aspect of the present invention includes the imaging element according to the first aspect.

DESCRIPTION OF EMBODIMENTS

Hereinafter, the present invention will be described in conjunction with an embodiment of the present invention, but the embodiment does not limit the inventions of the appended claims. All combinations of features described in the embodiment are not essential to a solution of the present invention.

In this specification, an X axis and a Y axis are perpendicular to each other, and a Z axis is perpendicular to an XY plane. The X, Y, and Z axes constitute a right-handed system. A direction (a Z-axis direction) parallel to the Z axis may be referred to as a stacking direction of an imaging element 400. In this specification, terms "up" and "down" are not limited to up and down in the gravitational direction. These terms are merely relative directions in the Z-axis direction.

In this specification, an array in the X-axis direction is referred to as a "row" and an array in the Y-axis direction is referred to as a "column," but the row and column directions are not limited thereto.

Figure 1:
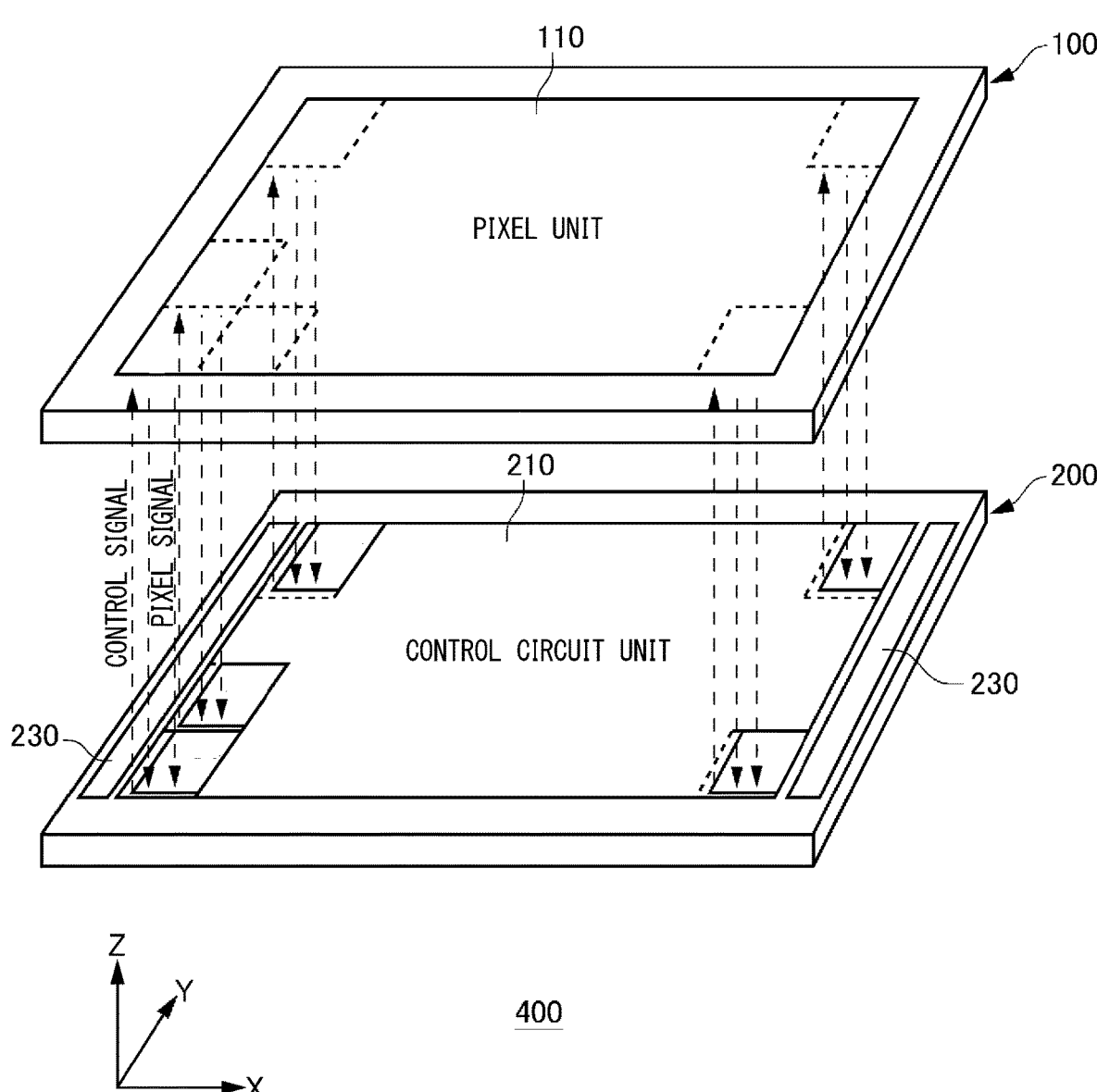
FIG. 1 is an exploded perspective view schematically illustrating an imaging element 400 according to an embodiment of the present invention.

FIG. 1 is an exploded perspective view schematically illustrating an imaging element 400 according to an embodiment. The imaging element 400 images a subject. The imaging element 400 generates image data of the imaged subject. The imaging element 400 includes a first substrate (a pixel chip) 100 and a second substrate (a signal processing chip) 200.

As illustrated in FIG. 1, the first substrate 100 is stacked on the second substrate 200.

The first substrate 100 includes a pixel unit 110. As will be described later, the pixel unit 110 includes a plurality of pixels 112. Each pixel 112 output a pixel signal based on incident light.

The second substrate 200 includes a main circuit unit 210 and a peripheral circuit unit 230.

Pixel signals output from the first substrate 100 are input to the main circuit unit 210. The main circuit unit 210 processes the input pixel signals. In this example, the main circuit unit 210 is disposed at a position on the second substrate 200 facing the pixel unit 110. The main circuit unit 210 may output a control signal for controlling drive of the pixel unit 110 to the pixel unit 110.

The peripheral circuit unit 230 controls driving of the main circuit unit 210. The peripheral circuit unit 230 is disposed around the main circuit unit 210 on the second substrate 200. The peripheral circuit unit 230 may be electrically connected to the first substrate 100 and control driving of the pixel unit 110. The peripheral circuit unit 230 in this example is arranged along two sides of the second substrate 200, but the arrangement of the peripheral circuit unit 230 is not limited to this example.

The imaging element 400 may include a third substrate which is stacked on the first substrate 100 and the second substrate 200. For example, the third substrate includes a data processing unit. For example, the data processing unit performs an addition process, a thinning process, and other image processing on signals output from the second substrate 200. The structure of the imaging element 400 may be a rear-surface illumination type or a front-surface illumination type.

Figure 2:
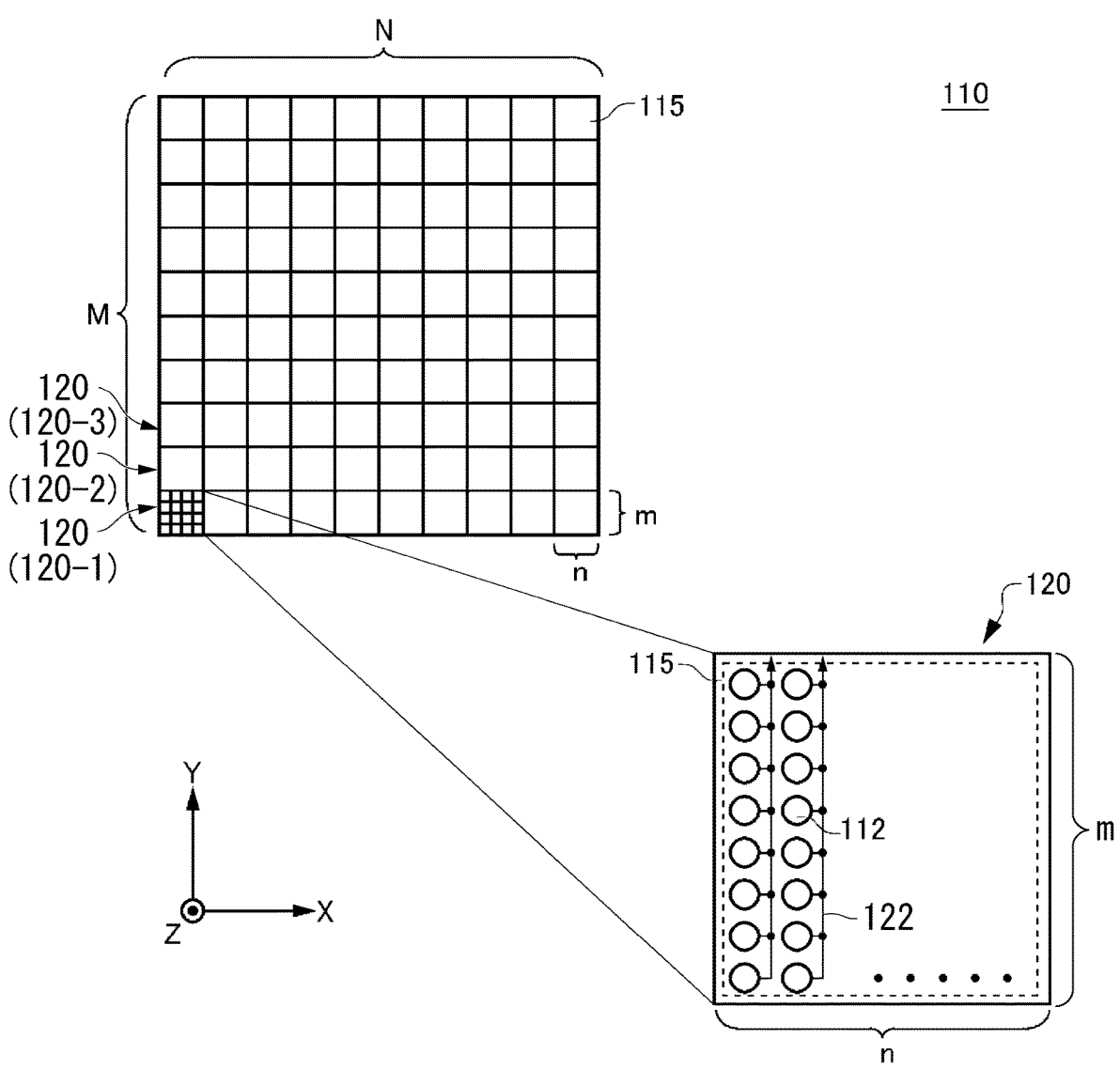
FIG. 2 is a plan view illustrating an example of a specific configuration of a pixel unit 110.

FIG. 2 illustrates an example of a specific configuration of the pixel unit 110. In this example, an enlarged view of the pixel unit 110 and a pixel block 120 provided in the pixel unit 110 is illustrated.

The pixel unit 110 includes a plurality of pixel groups 115 arranged in a row direction (a second direction) and a column direction (a first direction). The pixel unit 110 in this example includes M×N (where M and N are natural numbers) pixel blocks 120. In this example, it is assumed that M and N are equal to each other, but M and N may be different.

The first direction may be defined as the row direction and the second direction may be defined as the column direction.

Each pixel block 120 includes at least one pixel 112. In this example, each pixel block 120 includes m×n (where m and n are natural numbers) pixels 112. For example, each pixel block 120 includes 16×16 pixels 112. The number of pixels 112 corresponding to each pixel block 120 is not limited thereto. In this example, it is assumed that m and n are equal to each other, but m and n may be different.

In each pixel block 120, a plurality of pixels 112 are arranged in the row direction and the column direction.

For example, each pixel block 120 includes a plurality of pixels 112 connected to a common control line in the row direction. For example, the pixels 112 of each pixel block 120 are connected to a common control line such that the same exposure time is set. For example, n pixels 112 arranged in the row direction are connected to the common control line.

On the other hand, among different pixel blocks 120, one pixel block 120 may be set to an exposure time different from that of the other pixel block 120. For example, when one pixel block 120 and the other pixel block 120 are arranged in the same row, a plurality of pixels 112 in the m-th row of one pixel block 120 are commonly connected to a control line other than a common control line to which a plurality of pixels 112 in the m-th row of the other pixel block 120 are connected.

For example, when one pixel block 120 and the other pixel block 120 are arranged in the same column, a plurality of pixels 112 in the n-th row of one pixel block 120 are commonly connected to a signal line other than a common signal line to which a plurality of pixels 112 in the n-th row of the other pixel block 120 are connected.

Each pixel block 120 includes one or more pixels 112. The pixel blocks 120 are arranged to correspond to signal processing blocks 220 which will be described later. That is, one pixel block 120 is provided for one signal processing block 220. In one pixel block 120, m pixels 112 arranged in the column direction are connected to a common signal line.

In this example, one pixel block 120 is provided for one signal processing block 220. Each pixel block 120 includes m×n pixels 112. For example, each pixel block 120 includes 16×16 pixels 112. The number of pixels 112 corresponding to each pixel block 120 is not limited thereto. That is, each pixel block 120 may include one pixel 112.

When a plurality of pixel blocks 120 are provided for one signal processing block 220, the pixels blocks 120 may be set to different exposure times. In this case, each pixel block 120 includes 2m×n pixels 112. Specifically, for example, each pixel block 120 includes 32×16 pixels 112. The number of pixels 112 corresponding to each pixel block 120 is not limited thereto.

Each pixel 112 has a photoelectric conversion function of converting light to electric charge. The pixel 112 accumulates photoelectrically converted electric charge. Here, m pixels 112 are arranged in the column direction and are connected to a common signal line 122. The m pixels 112 are arranged in n columns in the row direction in each pixel block 120.

A plurality of pixel blocks 120 includes a first pixel block 120-1, a second pixel block 120-2, and a third pixel block 120-3. The first pixel block 120-1 includes a plurality of first pixels which are m×n pixels 112. The second pixel block 120-2 includes a plurality of second pixels which are m×n pixels 112. The third pixel block 120-3 includes a plurality of third pixels which are m×n pixels 112.

For example, the first pixel block 120-1, the second pixel block 120-2, and the third pixel block 120-3 are sequentially arranged in the column direction. That is, the second pixel block 120-2 is provided between the first pixel block 120-1 and the third pixel block 120-3.

Figure 3:
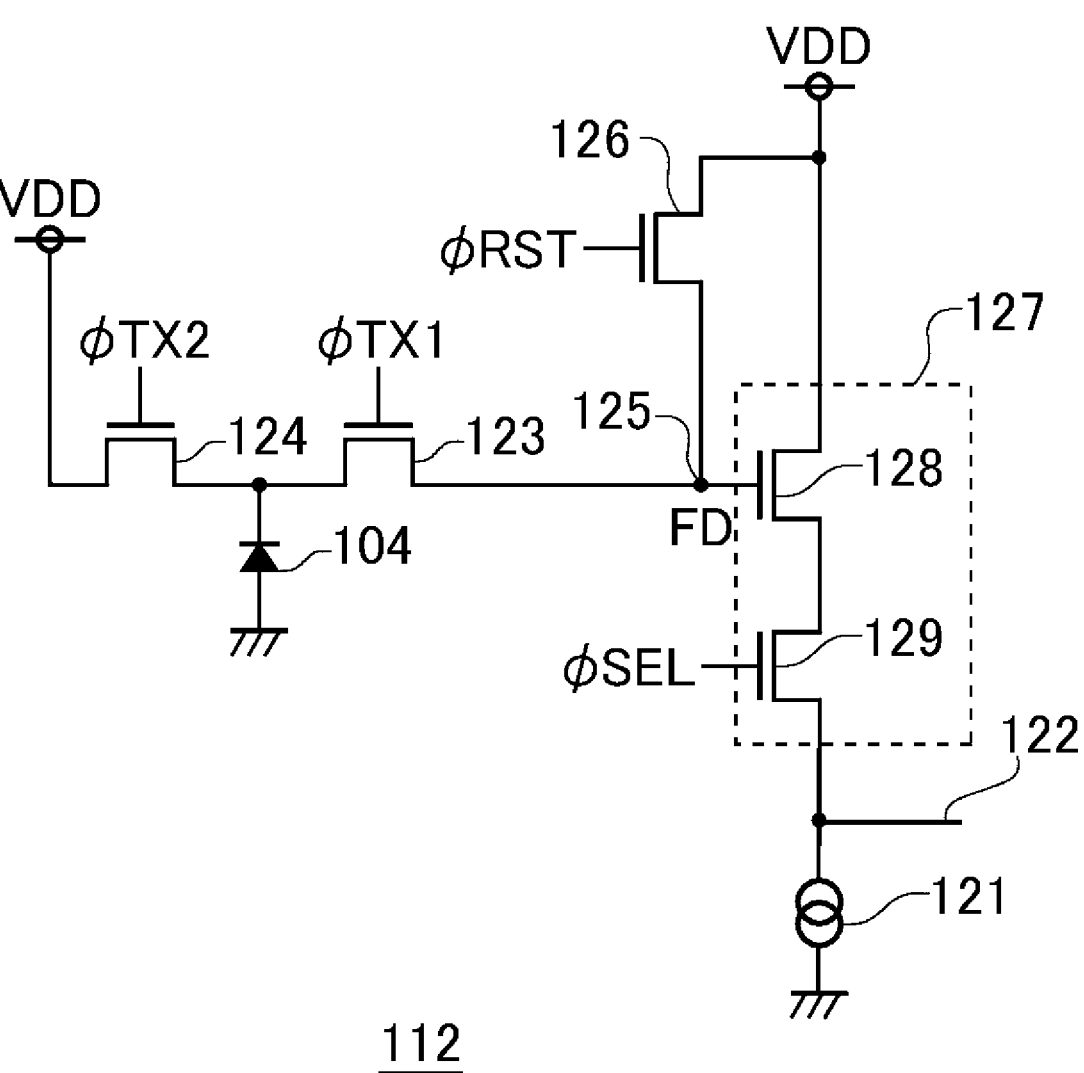
FIG. 3 is a diagram illustrating an example of a circuit configuration of a pixel 112.

FIG. 3 illustrates an example of a circuit configuration of a pixel 112. A pixel 112 includes a photoelectric converter 104, a transfer portion 123, a discharge portion 124, a reset portion 126, and a pixel output portion 127. The pixel output portion 127 includes an amplifier 128 and a selector 129.

In this example, the transfer portion 123, the discharge portion 124, the reset portion 126, the amplifier 128, and the selector 129 are N-channel FETs, but the type of the transistors is not limited thereto.

The photoelectric converter 104 has a photoelectric conversion function of converting light to electric charge. The photoelectric converter 104 accumulates the photoelectrically converted electric charge. The photoelectric converter 104 is constituted, for example, by a photodiode.

The transfer portion 123 transfers electric charge of the photoelectric converter 104 to an accumulator 125. The transfer portion 123 controls electrical connection between the photoelectric converter 104 and the accumulator 125. The transfer portion 123 is constituted, for example, by a transistor. The transfer portion 123 may be an element constituting a part of a transistor including a gate terminal, including a part of the photoelectric converter 104 as a source terminal, and including a part of the accumulator 125 as a drain terminal. The gate terminal of the transfer portion 123 is connected to a transfer control line 143 for inputting a transfer control signal φTX. The transfer control line 143 will be described later.

The discharge portion 124 controls connection between the photoelectric converter 104 and a power supply line and discharges electric charge accumulated in the photoelectric converter 104 to a power supply line through which a source voltage VDD is supplied. A gate terminal of the discharge portion 124 is connected to a discharge control line for inputting a discharge control signal φPDRST. The discharge portion 124 discharges electric charge of the photoelectric converter 104 to the power supply line through which the source voltage VDD is supplied, but may discharge the electric charge to a power supply line through which a source voltage other than the source voltage VDD is supplied.

Electric charge from the photoelectric converter 104 is transferred to the accumulator 125 by the transfer portion 123. The accumulator 125 is constituted, for example, by a floating diffusion (FD).

The reset portion 126 controls connection between the accumulator 125 and a power supply line and resets the potential of the photoelectric converter 104 to the source voltage VDD which is a reference potential. The reset portion 126 controls electrical connection between the accumulator 125 and the power supply line. The reset portion 126 is constituted, for example, by a transistor. The reset portion 126 may be an element constituting a part of a transistor including a gate terminal, including a part of the accumulator 125 as a source terminal, and including a part of a diffusion region connected to the power supply line as a drain terminal. The gate terminal of the reset portion 126 is connected to a reset control line 144 for inputting a reset control signal φRST. The reset control line 144 will be described later.

The pixel output portion 127 outputs a signal based on the potential of the accumulator 125 to a signal line 122. The pixel output portion 127 includes an amplifier 128 and a selector 129. The amplifier 128 and the selector 129 are constituted by transistors. A gate terminal of the amplifier 128 is connected to the accumulator 125, a drain terminal is connected to the power supply line through which the source voltage VDD is supplied, and a source terminal is connected to a drain terminal of the selector 129.

The selector 129 controls electrical connection between the pixel 112 and the signal line 122. When the pixel 112 and the signal line 122 are electrically connected by the selector 129, a pixel signal is output from the pixel 112 to the signal line 122. The selector 129 may be an element constituting a part of a transistor including a gate terminal, including a part of the amplifier 128 as a source terminal, and including a part of the diffusion region connected to the signal line 122 as a drain terminal. The gate terminal of the selector 129 is connected to a selection control line 145 covering a plurality of pixel blocks 120 and supplying a selection control signal φSEL. The source terminal of the selector 129 is connected to a load current source 121.

The load current source 121 is connected to the signal line 122 and supplies a current for reading a pixel signal from the pixel 112. Accordingly, it is possible to stabilize the operation of the amplifier 128. The load current source 121 is connected to the signal line 122. The load current source 121 may be provided in a first semiconductor substrate 100 or may be provided in a second semiconductor substrate 200.

The accumulator 125 and the pixel output portion 127 may be shared by another pixel 112. The pixel 112 may include a plurality of photoelectric converters 104 and a plurality of transfer portions 123.

Figure 4:
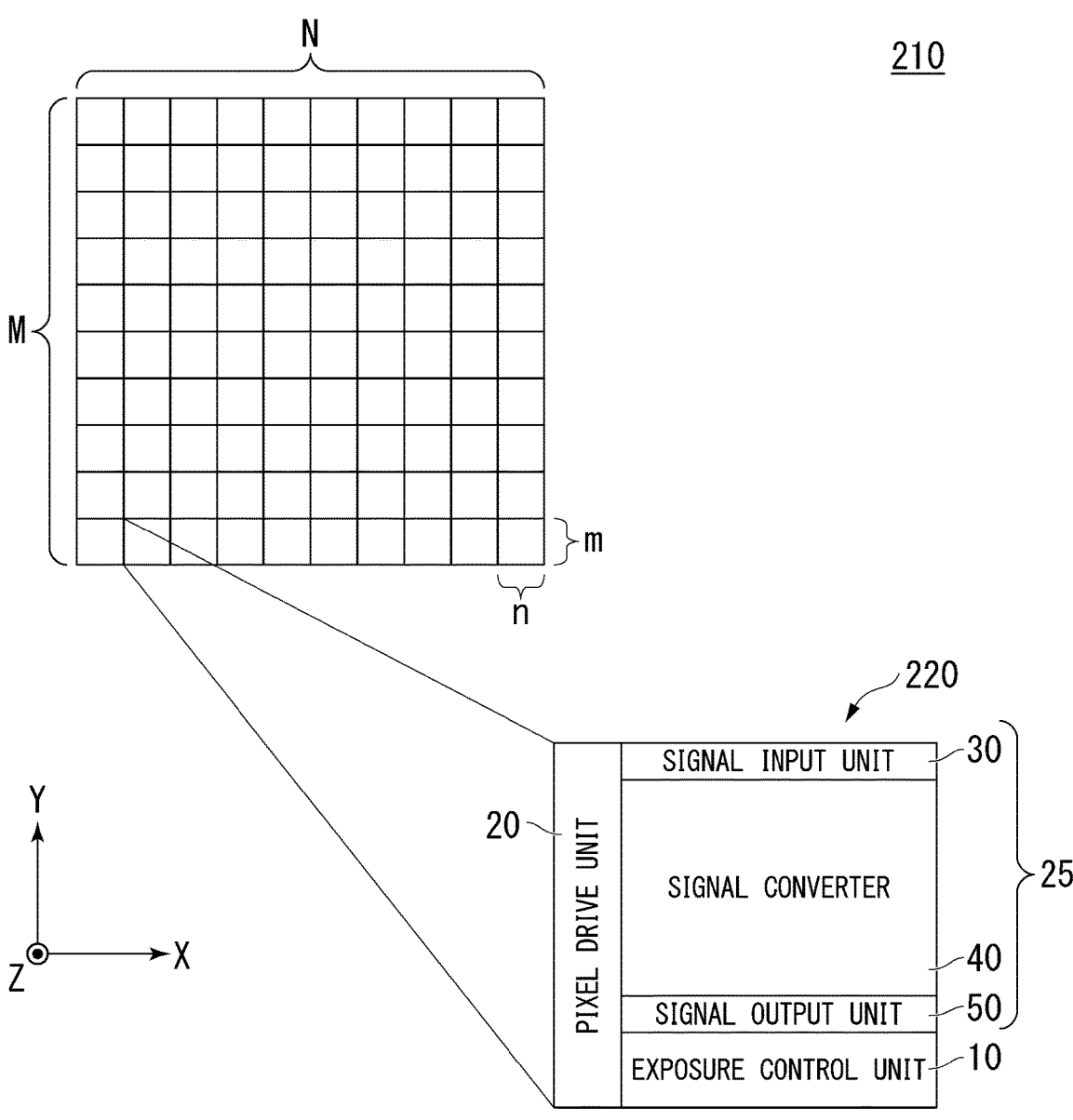
FIG. 4 is a diagram illustrating an example of a specific configuration of a main circuit unit 210.

FIG. 4 illustrates an example of a specific configuration of the main circuit unit 210. In this example, an enlarge view of the main circuit unit 210 and a signal processing block 220 provided in the main circuit unit 210 is illustrated.

The main circuit unit 210 includes signal processing blocks 220 which are arranged in the row direction and the column direction. The main circuit unit 210 in this example includes M×N signal processing blocks 220. The main circuit unit 210 includes the signal processing blocks 220 just below the pixel blocks 120. One pixel block 120 and one signal processing block 220 have almost the same shape and the same size. In this example, the main circuit unit 210 includes one signal processing block 220 for one pixel block 120.

The signal processing blocks 220 are located just below the pixel blocks 120 in the stacking direction. The signal processing blocks 220 located just below the pixel blocks 120 are electrically connected to the pixel blocks 120 just above in the stacking direction via a local control line such as the transfer control line 143 or the discharge control line. Each pixel block 120 outputs a pixel signal to the signal processing block 220 just below via the signal line 122.

The signal processing blocks 220 are arranged at positions corresponding to the pixel blocks 120. The signal processing blocks 220 control driving of the corresponding pixel blocks 120. For example, the signal processing blocks 220 controls the exposure time of the corresponding pixel blocks 120. The signal processing blocks 220 may control the exposure time of each pixel block 120.

Each signal processing block 220 includes a processing circuit such as an AD converter and processes a signal output from the corresponding pixel block 120. For example, each signal processing block 220 converts an analog pixel signal output from the corresponding pixel block 120 to a digital signal. Each signal processing block 220 in this example includes an exposure control unit 10, a pixel drive unit 20, and a signal processing unit 25.

The exposure control unit 10 controls exposure of a plurality of pixels 112. The exposure control unit 10 generates a signal for controlling an exposure time of the pixels 112. For example, the exposure control unit 10 adjusts at least one of an exposure start time and an exposure end time and controls the exposure time of each pixel block 120. The exposure control unit 10 in this example is provided to extend in the row direction.

The pixel drive unit 20 joins to the first substrate 100 and drives a plurality of pixels 112. The pixel drive unit 20 arbitrarily selects and drives an arbitrary pixel 112 out of the plurality of pixels 112. The pixel drive unit 20 in this example is provided to extend in the column direction. Accordingly, the pixel drive unit 20 is arranged at positions corresponding to m pixels 112 arranged in the column direction. The exposure control unit 10 and the pixel drive unit 20 are arranged in an L-shape because the pixel drive unit 20 extends in the column direction and the exposure control unit 10 extends in the row direction.

The signal processing unit 25 includes a signal input unit 30, a plurality of signal converters 40, and a signal output unit 50.

The signal input unit 30 joins the first substrate 100 and the second substrate 200. The signal input unit 30 inputs a pixel signal input from the first substrate 100 to the plurality of signal converters 40. The signal input unit 30 is provided to correspond to n pixels 112 arranged in the row direction and inputs a pixel signal to the plurality of signal converters 40 for each column.

Each signal converter 40 includes an analog-to-digital converter (ADC). Here, n signal converters 40 are provided to correspond to n pixels 112. The plurality of signal converters 40 digitally converts (processes) an analog signal (a signal) from the pixels 112 output from the pixel unit 110. The plurality of signal converters 40 in this example convert an analog pixel signal to a digital signal. Each signal converter 40 sequentially digitally converts analog signals from m pixels 112 arranged in the column direction. The plurality of signal converters 40 digitally convert analog signals from the pixels 112 arranged in the n columns in the row direction in parallel.

Each signal processing block 220 may include one signal converter 40.

The signal output unit 50 receives a digital signal from the plurality of signal converters 40. For example, the signal output unit 50 temporarily stores the digital signal. The signal output unit 50 may include a latch circuit for storing a digital signal.

The signal output unit 50 is provided between the signal converter 40 and the exposure control unit 10 in the column direction and outputs a digital signal. The signal output unit 50 in this example outputs a digital signal to the outside of the main circuit unit 210. The signal output unit 50 extends in the row direction and are provided adjacent to the signal converter 40 and the exposure control unit 10.

The imaging element 400 in this example has a function of reading pixel signals in parallel using the signal processing blocks 220 provided to correspond to the pixel blocks 120. The imaging element 400, since the exposure time for each pixel block 120 can be set, it is possible to enlarge a dynamic range.

Figure 5:
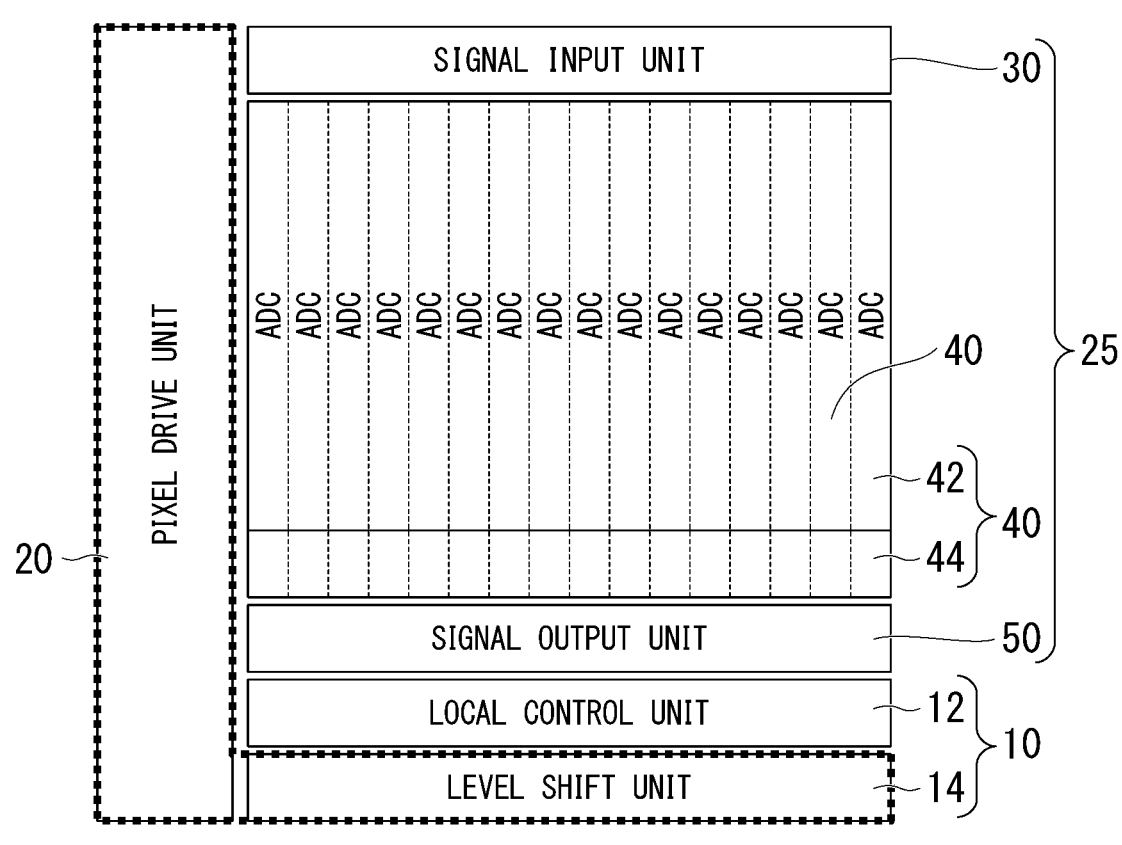
FIG. 5 is a plan view illustrating an example of a specific configuration of a signal processing block 220.
Figure 5:
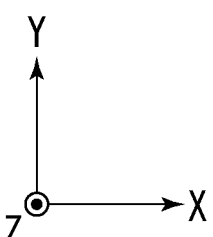

FIG. 5 illustrates an example of a specific configuration of a signal processing block 220. Each signal converter 40 in this example includes a comparator 42 and a storage unit 44. Each signal processing block 220 in this example includes a local control unit 12 and a level shift unit 14 constituting the exposure control unit 10.

The comparator 42 is provided to extend in the column direction. Here, n comparators 42 are arranged in the row direction. One comparator 42 is provided for m pixels 112. The comparator 42 sequentially reads pixel signals of the m pixels 112 and digitally converts the pixel signal.

The storage unit 44 temporarily stores a digital signal from the comparator 42. The storage unit 44 in this example is provided on the negative side in the Y-axis direction with respect to the comparator 42 in the signal converter 40. For example, the storage unit 44 includes a latch circuit. The storage unit 44 may include a memory constituted by an SRAM or the like.

The local control unit 12 outputs a control signal for controlling the operations of the transfer portion 123 and the discharge portion 124. The local control unit 12 locally controls one of a first transfer control signal φTX1 and a second transfer control signal φTX2.

In this specification, local control means that driving of each pixel block 120 is controlled. For example, the local control unit 12 performs local control using the second transfer control signal φTX2. The local control unit 12 is provided to extend in the row direction. The local control unit 12 is provided between the level shift unit 14 and the signal output unit 50.

The level shift unit 14 converts and outputs a voltage level of the control signal output from the local control unit 12. The level shift unit 14 is provided to extend in the row direction. The level shift unit 14 provided on an outer side of the local control unit 12 in the signal processing block 220. A positive end in the X-axis direction and a negative end in the Y-axis direction of the level shift unit 14 are located at the outermost of the signal processing block 220. The negative end in the X-axis direction of the level shift unit 14 is adjacent to the pixel drive unit 20.

The level shift unit 14 and the pixel drive unit 20 handle level-shifted signals. On the other hand, the local control unit 12, the level shift unit 14, and the pixel drive unit 20 hand pixel signals output from the first substrate 100.

Figure 6:
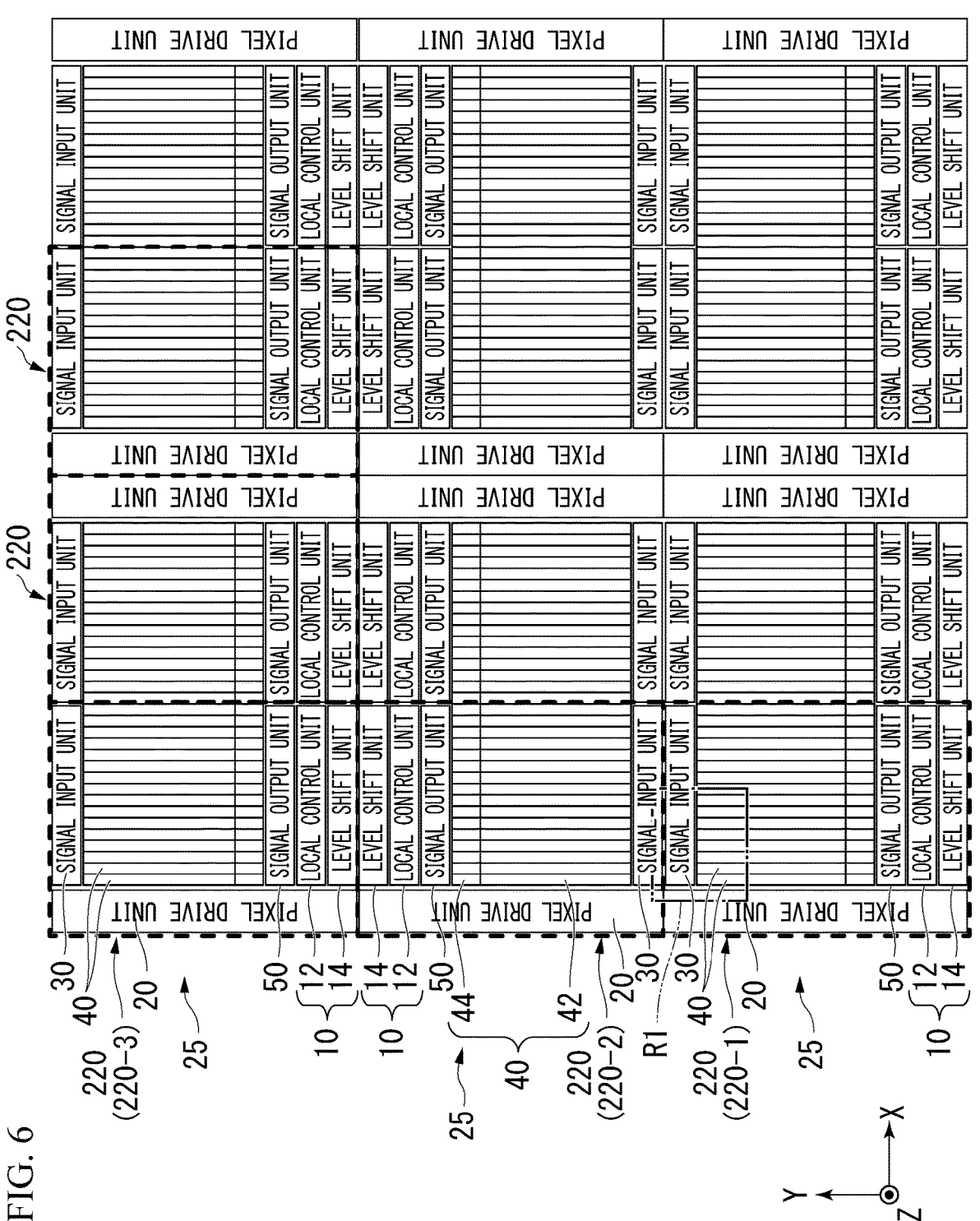
FIG. 6 is a plan view illustrating an example of a plurality of signal processing blocks 220 according to an example.

FIG. 6 illustrates an example of a plurality of signal processing blocks 220 according to the embodiment. A plurality of signal processing blocks 220 in this example are arranged such that neighboring signal processing blocks 220 are reversed. In the drawing, 12 signal processing blocks 220 out of a plurality of signal processing blocks 220 provided in the main circuit unit 210 are illustrated.

Reversed arrangement means that areas in which the constituents (for example, the exposure control unit 10, the pixel drive unit 20, and the signal processing unit 25) of the signal processing blocks 220 are formed are arranged symmetric with respect to a boundary line between the blocks.

That is, circuits of the constituents of the signal processing blocks 220 may not be arranged reversely. The order of reading pixels in the signal processing blocks 220 is not limited to reversed reading.

Three signal processing blocks 220 arranged in the Y-axis direction at the negative end in the X-axis direction out of 12 signal processing blocks 220 will be described below.

In this embodiment, for the purpose of convenience of explanation, three signal processing blocks 220 arranged in the Y-axis direction at the negative end in the X-axis direction are referred to as first to third signal processing blocks 220-1 to 220-3 as will be described below, and arbitrary three signal processing blocks 220 arranged in the Y-axis direction can be referred to as first to third signal processing blocks.

Figure 7:
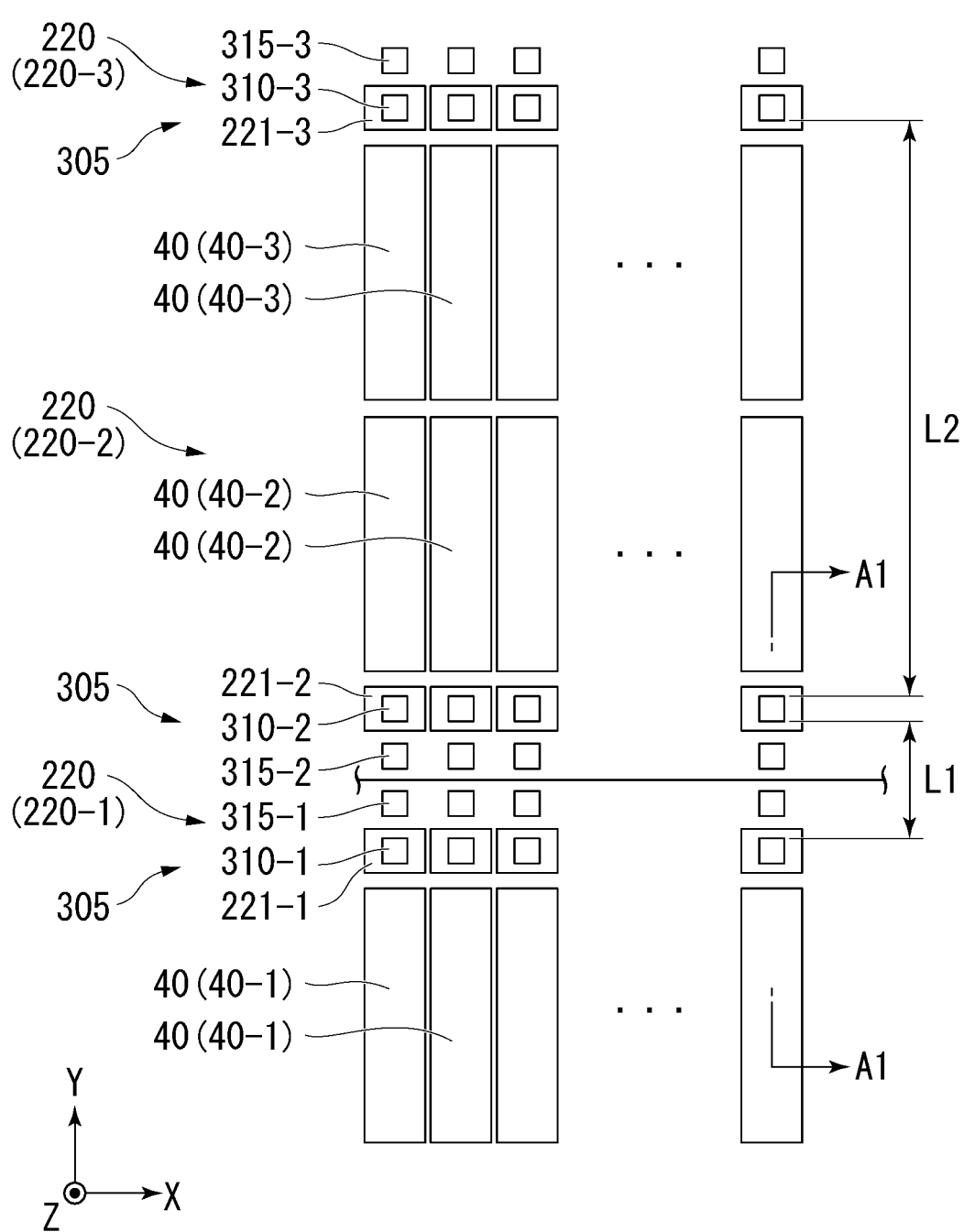
FIG. 7 is a plan view illustrating details of an example of a plurality of signal processing blocks 220 according to an example.

As illustrated in FIG. 7, three signal processing blocks 220 include a first signal processing block 220-1, a second signal processing block 220-2, and a third signal processing block 220-3. In FIG. 7, FIGS. 15 and 17, and FIGS. 24 to 28, the configuration of the signal processing blocks 220 (the signal processing unit 25) is focused.

Out of a plurality of pixels 112, pixels 112 of which signals are processed by the first signal processing block 220-1, the second signal processing block 220-2, and the third signal processing block 220-3 are referred to as a plurality of first pixels, a plurality of second pixels, and a plurality of third pixels.

The first signal processing block 220-1 includes a plurality of first signal converters 40-1 that process signals from the plurality of first pixels. The plurality of first signal converters 40-1 are arranged in the row direction.

The second signal processing block 220-2 includes a plurality of second signal converters 40-2 that process signals from the plurality of second pixels. The third signal processing block 220-3 includes a plurality of third signal converters 40-3 that process signals from the plurality of third pixels.

Each of the signal processing blocks 220-1, 220-2, and 220-3 may include a single signal converter 40-1, 40-2, or 40-2.

Figure 8:
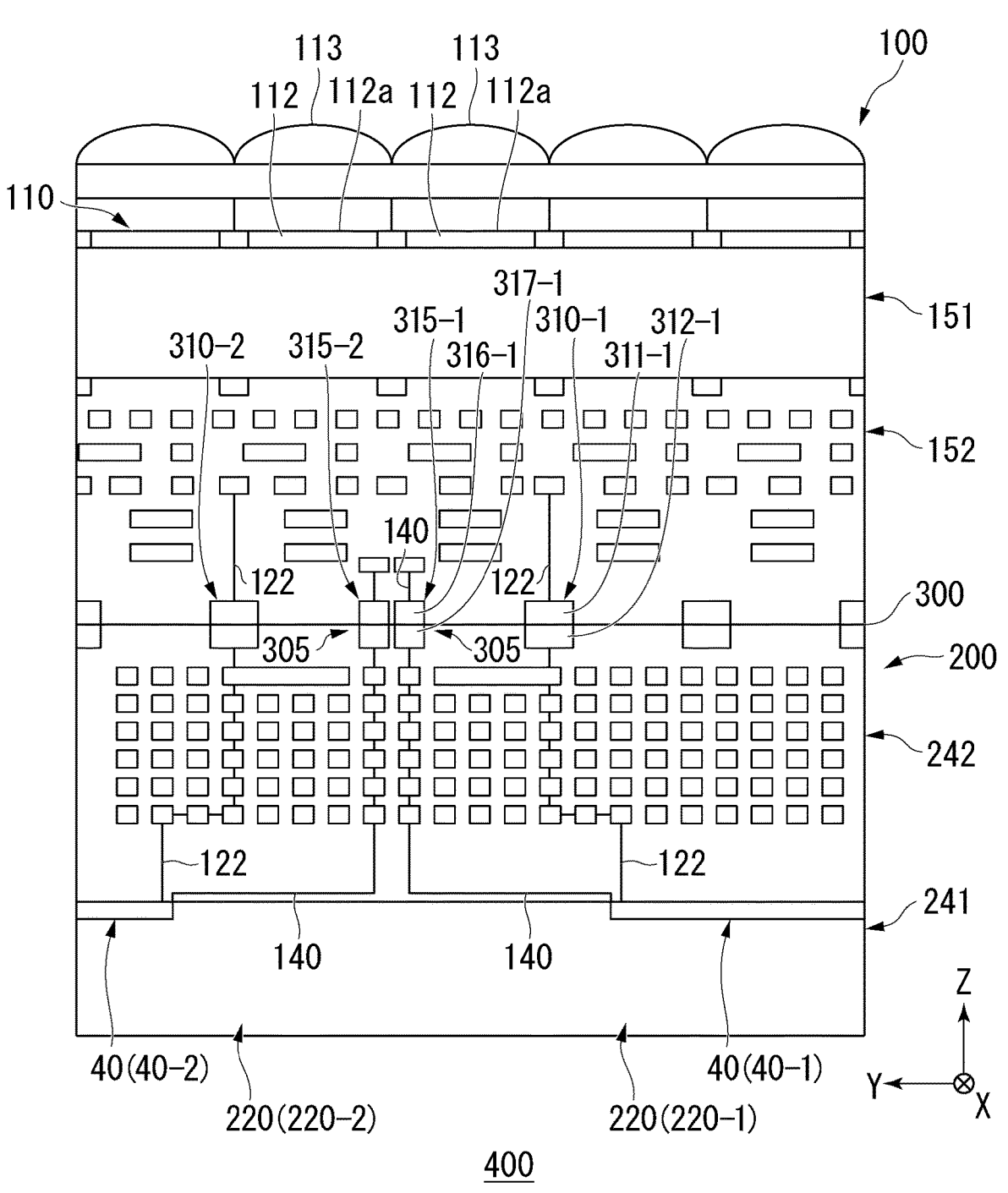
FIG. 8 is a sectional view along line A1-A1 in FIG. 7.

As illustrated in FIG. 8, the first substrate 100 and the second substrate 200 include semiconductor layers 151 and 241 and wiring layers 152 and 242. In the first substrate 100, the pixel unit 110 is mainly formed in the semiconductor layer 151. In the second substrate 200, the main circuit unit 210 is mainly formed in the semiconductor layer 241. The semiconductor layer 151 of the first substrate 100 is located opposite to the second substrate 200 with the wiring layer 152 of the first substrate 100 interposed therebetween in the Z-axis direction. The semiconductor layer 24 of the second substrate 200 is located opposite to the first substrate 100 with the wiring layer 242 of the second substrate 200 interposed therebetween in the Z-axis direction. The wiring layer 152 of the first substrate 100 is located between the semiconductor layer 151 of the first substrate 100 and the wiring layer 242 of the second substrate 200. The wiring layer 242 of the second substrate 200 is located between the wiring layer 152 of the first substrate 100 and the semiconductor layer 241 of the second substrate 200. The first substrate 100 and the second substrate 200 are jointed to a joint surface 300. The semiconductor layer 151 of the first substrate 100, the wiring layer 152 of the first substrate 100, the wiring layer 242 of the second substrate 200, and the semiconductor layer 241 of the second substrate 200 are stacked in this order.

The imaging element 400 includes a micro lens 113 and a color filter. The micro lens 113 and the color filter are provided for each pixel 112. The photoelectric converter 104 of each pixel 112 receives light passing through the micro lens 113 and the color filter. The surface of the photoelectric converter 104 serves as a light receiving surface 112a of the pixel 112. A direction perpendicular to the light receiving surface 112a and a direction parallel to an optical axis of the micro lens 113 are a direction parallel to the Z axis (a stacking direction).

Joint on the joint surface 300 between the first substrate 100 and the second substrate 200 will be described below. Particularly, joint between the first to third pixel blocks in the first substrate 100 and the first to third signal processing blocks in the second substrate 200 will be described.

As illustrated in FIGS. 7 and 8, the imaging element 400 in this example includes a plurality of joints 305 on the joint surface 300. The joints 305 join the first substrate 100 and the second substrate 200. The joints 305 are joints for inputting pixel signals from the first substrate 100 to the signal converters 40 of the second substrate 200. For example, the imaging element 400 includes a plurality of first signal joints 310-1, a plurality of second signal joints 310-2, and a plurality of third signal joints 310-3 as the plurality of joints 305. The imaging element 400 includes a plurality of first reference potential joints 315-1, a plurality of second reference potential joints 315-2, and a plurality of third reference potential joints 315-3 as the plurality of joints 305.

In FIG. 7, the joints 310-1, 310-2, 310-3, 315-1, 315-2, and 315-3 and the signal converters 40 are illustrated to be present on the same surface, but they are actually different in position in the Z axis direction as illustrated in FIG. 8.

In the following description, the signal joints 310-1, 310-2, and 310-3 are referred to as signal joints 310 when they are mentioned regardless of the signal processing blocks 220, and the reference potential joints 315-1, 315-2, and 315-3 are referred to as reference potential joints 315 when they are mentioned regardless of the signal processing blocks 220.

The signal joints 310 output signals from the pixels 112 to the signal converter 40 via the signal input unit 30. The reference potential joints 315 are used for a reference potential of the signal processing block 220. The reference potential is, for example, a ground voltage.

As illustrated in FIG. 7, the first signal joint 310-1, the second signal joint 310-2, and the third signal joint 310-3 are arranged in this order in the column direction.

The first signal joint 310-1 outputs a signal from the first pixel to the first signal converter 40-1.

As illustrated in FIG. 7, the first signal joint 310-1, the reference potential joints 315-1 and 315-2, the second signal joint 310-2, the third signal joint 310-3, and the third reference potential joint 315-3 are arranged in this order in the column direction on the joint surface 300. Particularly, the first signal joint 310-1, the reference potential joints 315-1 and 315-2, and the second signal joint 310-2 are arranged close to each other in the column direction.

When seen in the Z-axis direction, the first signal converter 40-1, the first signal joint 310-1, the reference potential joints 315-1 and 315-2, the second signal joint 310-2, the second signal converter 40-2, the third signal converter 40-3, the third signal joint 310-3, and the third reference potential joint 315-3 are arranged in this order in the column direction. In FIG. 7, the signal output unit 50, the local control unit 12, and the level shift unit 14 are omitted between the second signal converter 40-2 and the third signal converter 40-3.

As illustrated in FIG. 8, the first signal joint 310-1 includes a first signal pad (first pad) 311-1 and a second signal pad (second pad) 312-1. The first signal pad (first pad) 311-1 the second signal pad (second pad) 312-1 are electrically connected to each other.

The first signal pad 311-1 and the second signal pad 312-1 are formed of a metal having conductivity such as copper or copper alloy. For example, the first signal pad 311-1 and the second signal pad 312-1 have a rectangular shape in a plan view.

The first signal pad 311-1 is provided on an end face (the joint surface 300) of the first substrate 100 on the second substrate 200 side. The second signal pad 312-1 is provided on an end face (the joint surface 300) of the second substrate 200 on the first substrate 100 side.

The first signal pad 311-1 is connected to the first pixel via the signal line 122. The second signal pad 312-1 is connected to the signal input unit 30 via the signal line 122. The signal input unit 30 outputs a signal from the first pixel to the first signal converter 40-1.

The second signal joint 310-2 outputs a signal from the second pixel to the second signal converter 40-2. The third signal joint 310-3 outputs a signal from the third pixel to the third signal converter 40-3. The second signal joint 310-2 and the third signal joint 310-3 have the same configuration as the first signal joint 310-1.

As illustrated in FIG. 7, an interval L1 in the column direction between the first signal joint 310-1 and the second signal joint 310-2 is smaller than an interval L2 in the column direction between the second signal joint 310-2 and the third signal joint 310-3. An interval in the column direction between the first reference potential joint 315-1 and the second reference potential joint 315-2 is smaller than an interval in the column direction between the second reference potential joint 315-2 and the third reference potential joint 315-3.

As illustrated in FIG. 8, the first signal converter 40-1, the second signal converter 40-2, and the third signal converter 40-3 are arranged in the semiconductor layer 241 in the second substrate 200. For example, the pixel drive unit 20 is also arranged in the semiconductor layer 241.

When the imaging element 400 is seen in the Z-axis direction, the first signal converter 40-1, the first signal joint 310-1, the second signal joint 310-2, and the second signal converter 40-2 are arranged in the Y-axis direction in the order of the first signal converter 40-1, the first signal joint 310-1, the second signal joint 310-2, and the second signal converter 40-2.

The first reference potential joint 315-1 is used for a reference potential of the first signal processing block 220-1. The first reference potential joint 315-1 has the same configuration as the first signal joint 310-1. The first reference potential joint 315-1 includes a first reference potential pad 316-1 and a second reference potential pad 317-1 having the same configuration as the first signal pad 311-1 and the second signal pad 312-1 of the first signal joint 310-1. The first reference potential pad 316-1 and the second reference potential pad 317-1 are electrically connected.

Although not illustrated, the first reference potential pad 316-1 is connected to a reference potential pad provided on the surface of the first substrate 100 opposite to the second substrate 200 via a reference potential line 140. The second reference potential pad 317-1 is connected to a GND port or the like of the first signal converter 40-1 via the reference potential line 140.

The second reference potential joint 315-2 and the third reference potential joint 315-3 are used for the reference potentials of the second signal processing block 220-2 and the third signal processing block 220-3. The second reference potential joint 315-2 and the third reference potential joint 315-3 have the same configuration as the first reference potential joint 315-1.

The first signal joint 310-1, the second signal joint 310-2, and the third signal joint 310-3 join the first substrate 100 and the second substrate 200. Similarly, the first reference potential joint 315-1, the second reference potential joint 315-2, and the third reference potential joint 315-3 join the first substrate 100 and the second substrate 200.

Figure 9:
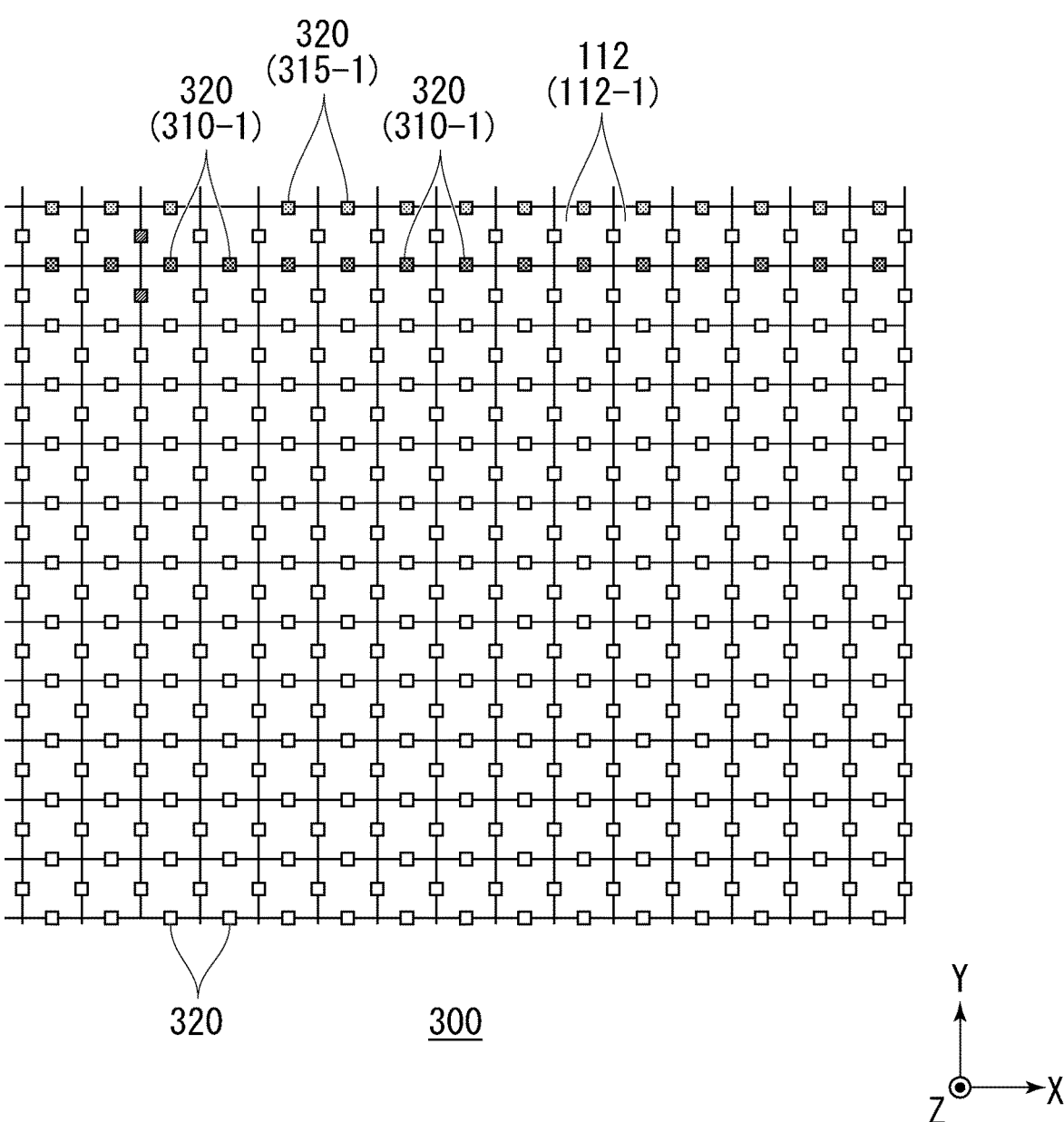
FIG. 9 is a sectional view illustrating an example of a joint surface 300 between a first substrate 100 and a second substrate 200.

As illustrated in FIG. 9, a plurality of reference joints (bumps) 320 including the joints 310-1, 310-2, 310-3, 315-1, 315-2, and 315-3 are arranged in the row direction and the column direction on the joint surface 300. FIG. 9 illustrates the reference joints 320 corresponding to the range R1 in FIG. 6.

For example, a plurality of reference joints 320 are arranged at positions corresponding to a plurality of pixels 112. In FIG. 9, the first signal joints 310-1 and the first reference potential joints 315-1 are illustrated.

Out of the plurality of reference joints 320, the reference joints 320 connected to the first signal converter 40-1 or the like via the signal line 122 or the like are used as the joints 310-1, 310-2, 310-3, 315-1, 315-2, and 315-3 and the first reference potential joints 315-1 which will be described later. The plurality of reference joints 320 are also arranged at positions on the joint surface 300 corresponding to the pixel drive unit 20, the plurality of signal converters 40, or the like.

Figure 10:
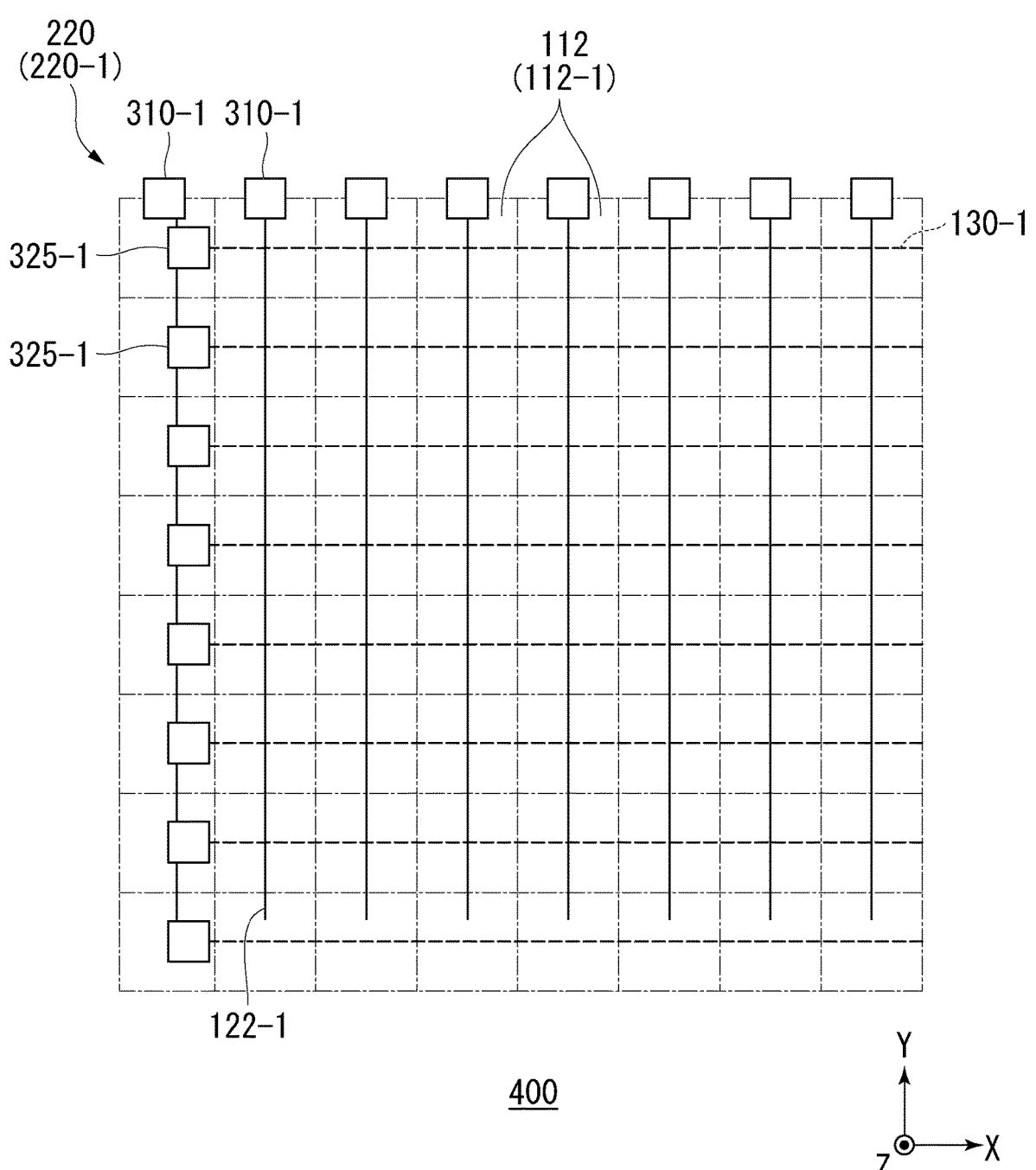
FIG. 10 is a plan view schematically illustrating an example of arrangement of first signal joints 310-1 and first control joints 325-1.

As illustrated in FIG. 10, for example, when the imaging element 400 is seen in the Z-axis direction, a plurality of first signal joints 310-1 are arranged at positions at which at least a part overlaps one first pixel 112-1 at the first end in the column direction and at least a part overlaps a plurality of first pixels 112-1 arranged in the column direction.

A first signal line 122-1 for transferring a signal from the first pixels 112-1 is connected to the first signal joints 310-1. The first signal line 122-1 is provided in each of the first substrate 100 and the second substrate 200. The first signal joints 310-1 transfers signals from the first pixels 112-1 to the signal input unit 30 via the first signal joints 310-1. A part of the first signal line 122-1 provided in the first substrate 100 extends in the column direction.

The imaging element 400 in this example includes a plurality of control joints 325 on the joint surface 300. The control joints 325 are joints for transferring a control signal for controlling the pixels 112 of the pixel block 120 from the pixel drive unit 20 of the signal processing block 220 to a plurality of first pixels 112. For example, the imaging element 400 in this example includes a plurality of first control joints 325-1 on the joint surface 300. The first control joints 325 are joints for transferring a control signal for controlling a plurality of first pixels 112-1 from the first signal processing block 220-1 to the plurality of first pixel blocks 120-1. The plurality of first control joints 325-1 have the same configuration as the first signal joints 310-1 and join the first substrate 100 and the second substrate 200. The plurality of first control joints 325-1 are arranged at positions overlapping the pixel drive unit 20 of the first signal processing block 220-1 when seen in the Z-axis direction on the joint surface 300 between the first substrate 100 and the second substrate 200.

In the following description, the control joints are referred to as control joints 325 when they are mentioned regardless of the signal processing blocks 220.

A first control line 130-1 for transferring a signal for controlling the first pixels 112-1 is connected to the first control joints 325-1. The first control line 130-1 transfers a control signal from the pixel drive unit 20 to the first pixels 112-1 via the first control joints 325-1. The first control line 130-1 extends in the row direction from the first control joints 325-1.

For example, when the imaging element 400 is seen in the Z-axis direction, a plurality of first control joints 325-1 are arranged at positions at which at least a part overlaps one first pixel 112-1 at the first end in the row direction and at least a part overlaps a plurality of first pixels 112-1 arranged in the column direction.

That is, two joints 310-1 and 325-1 are arranged at a position corresponding to the first pixel 112-1 disposed at the first end in the row direction and the first end in the column direction.

As illustrated in FIG. 7, the first signal processing block 220-1 includes a first load current source 221-1. The first load current source 221-1 is a current source used to read signals of a plurality of first pixels. The first load current source 221-1 is connected to the first signal line 122-1 and supplies a current to the pixels 112-1 via the first signal joint 310-1. Accordingly, in the first signal processing block 220-1, the first load current source 221-1 is disposed at a position overlapping the first signal joint 310-1 when seen in the Z-axis direction.

The second signal processing block 220-2 and the third signal processing block 220-3 include a second load current source 221-2 and a third load current source 221-3 having the same configuration as the first load current source 221-1.

Figure 11:
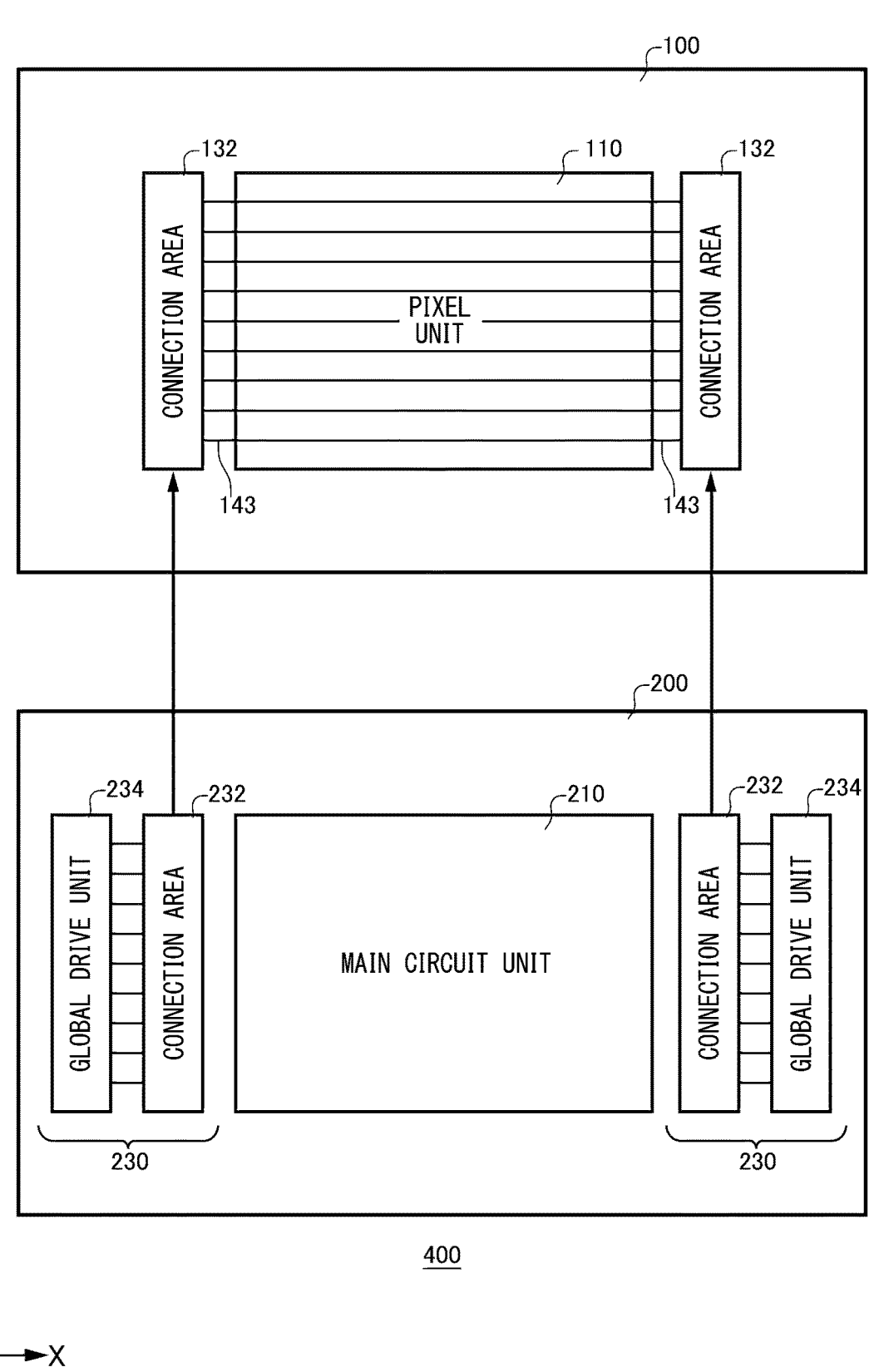
FIG. 11 is a plan view schematically illustrating an example of a configuration of the imaging element 400.

FIG. 11 illustrates an example of a configuration of the imaging element 400. In this example, an example of a wiring method of the imaging element 400 is described.

The first substrate 100 includes connection areas 132 provided at both ends of the pixel unit 110. The second substrate 200 includes a connection area 232 and a global drive unit 234 provided in the peripheral circuit unit 230.

The global drive unit 234 outputs a control signal for driving the pixels 112 to the connection area 232. For example, the global drive unit 234 outputs a reset control signal φRST and a selection control signal φSEL as the control signal.

The connection area 232 outputs the control signal from the global drive unit 234 to the connection area 132. For example, the connection area 232 is electrically connected to the connection area 132 via a conductive via or the like.

The connection area 132 controls driving of the pixel unit 110 by outputting the control signal to the pixel unit 110. The connection area 132 in this example outputs the control signal to the pixel unit 110 via a transfer control line 143, a reset control line 144, and a selection control line 145 extending in the row direction. That is, the imaging element 400 in this example globally controls the pixel unit 110 using the reset control signal φRST and the selection control signal φSEL.

The imaging element 400 in this example outputs the control signal from the second substrate 200 to the first substrate 100 and then returns a pixel signal from the pixel unit 110 to the main circuit unit 210. Here, the global drive unit 234 of the imaging element 400 may be provided in the first substrate 100.

Figure 12:
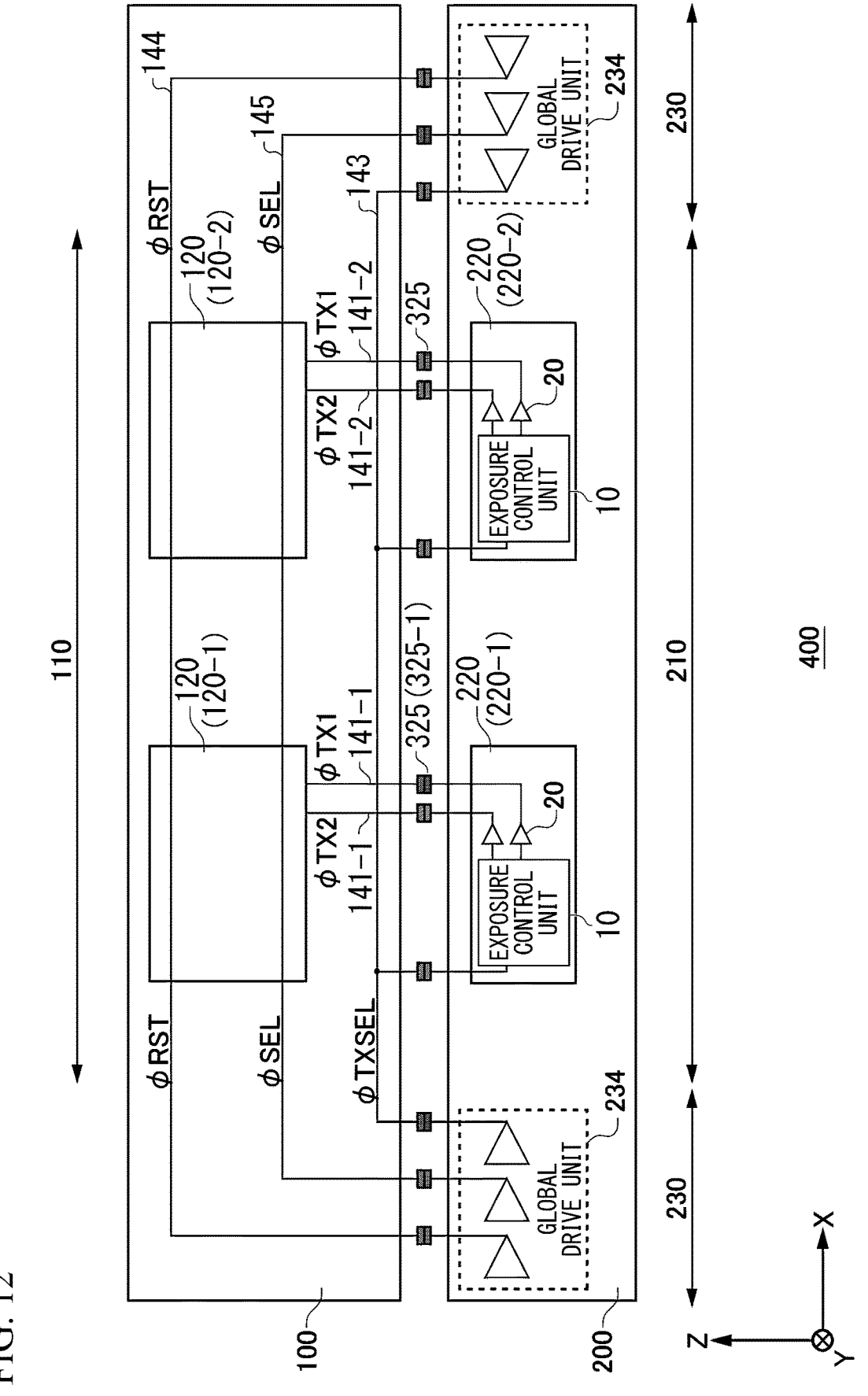
FIG. 12 is a diagram illustrating an example of a wiring method of the imaging element 400.

FIG. 12 is a diagram illustrating an example of a wiring method of the imaging element 400. The global drive unit 234 in this example is provided in the peripheral circuit unit 230 disposed with both ends of the main circuit unit 210 interposed therebetween.

A local control line 141-1 is connected to the first pixel block 120-1. The local control line 141 in this example is connected to the gate terminals of the transfer portion 123 and the discharge portion 124 provided in the first pixel block 120-1. The local control line 141-1 supplies a first transfer control signal φTX1 and a second transfer control signal φTX2 output from the first signal processing block 220-1 via the control joint 325 to the first pixel block 120-1.

The local control line 141-1 may be provided to the pixel block 120. For example, in each pixel block 120,m a common local control line 141-1 is connected to n pixels 112 arranged in the row direction.

A local control line 141-2 is connected to the second pixel block 120-2. The local control line 141-2 in this example is connected to the gate terminals of the transfer portion 123 and the discharge portion 124 provided in the second pixel block 120-2. The local control line 141-2 supplies a first transfer control signal φTX1 and a second transfer control signal φTX2 output from the second signal processing block 220-2 via the control joint 325 to the second pixel block 120-2.

The global drive unit 234 outputs the reset control signal φRST, the selection control signal φSEL, and a transfer selection control signal φTXSEL. The global drive unit 234 is connected to the reset control line 144 and the selection control line 145 for outputting a signal to each pixel block 120.

The global drive unit 234 supplies the reset control signal φRST to a plurality of pixel blocks 120 via the reset control line 144. The global drive unit 234 supplies the selection control signal φSEL to a plurality of pixel blocks 120 via the selection control line 145. The global drive unit 234 supplies the transfer selection control signal φTXSEL to a plurality of signal processing blocks 220 via a transfer selection control line.

The transfer selection control signal φTXSEL is supplied from the global drive unit 234 to the signal processing block 220 to control an exposure time of each pixel block 120. The signal processing block 220 supplied with the transfer selection control signal φTXSEL outputs the transfer selection control signal φTXSEL to the corresponding pixel block 120. The pixel block 120 determines whether the transfer selection control signal φTXSEL is input to the pixels 112 as the first transfer control signal φTX1 or the second transfer control signal φTX2. Accordingly, inputting of the first transfer control signal φTX1 or the second transfer control signal φTX2 to the pixels 112 is skipped.

For example, when the first transfer control signal φTX1 determines an exposure end time, the signal processing block 220 extends the exposure time by skipping the first transfer control signal φTX1.

In this way, it is possible to adjust the exposure time of the pixel block 120 using the transfer selection control signal φTXSEL. The same is true when the second transfer control signal φTX2 determines an exposure start time or an exposure end time.

The transfer control line 143 is commonly provided in a plurality of pixel blocks 120. The transfer control line 143 in this example is wired to cross the first substrate 100 in the row direction. The transfer control line 143 may be wired to cross the first substrate 100 in the column direction. Similarly, the reset control line 144 and the selection control line 145 are commonly provided in the plurality of pixel blocks 120.

For example, the transfer control line 143 is connected to the gate terminals of the reset portion 126 and the selector 129 of each pixel block 120 and supplies the reset control signal φRST and the selection control signal φSEL thereto. The transfer control line 143 is connected to a plurality of signal processing blocks 220 and supplies the transfer selection control signal φTXSEL to the exposure control unit 10.

Figure 13:
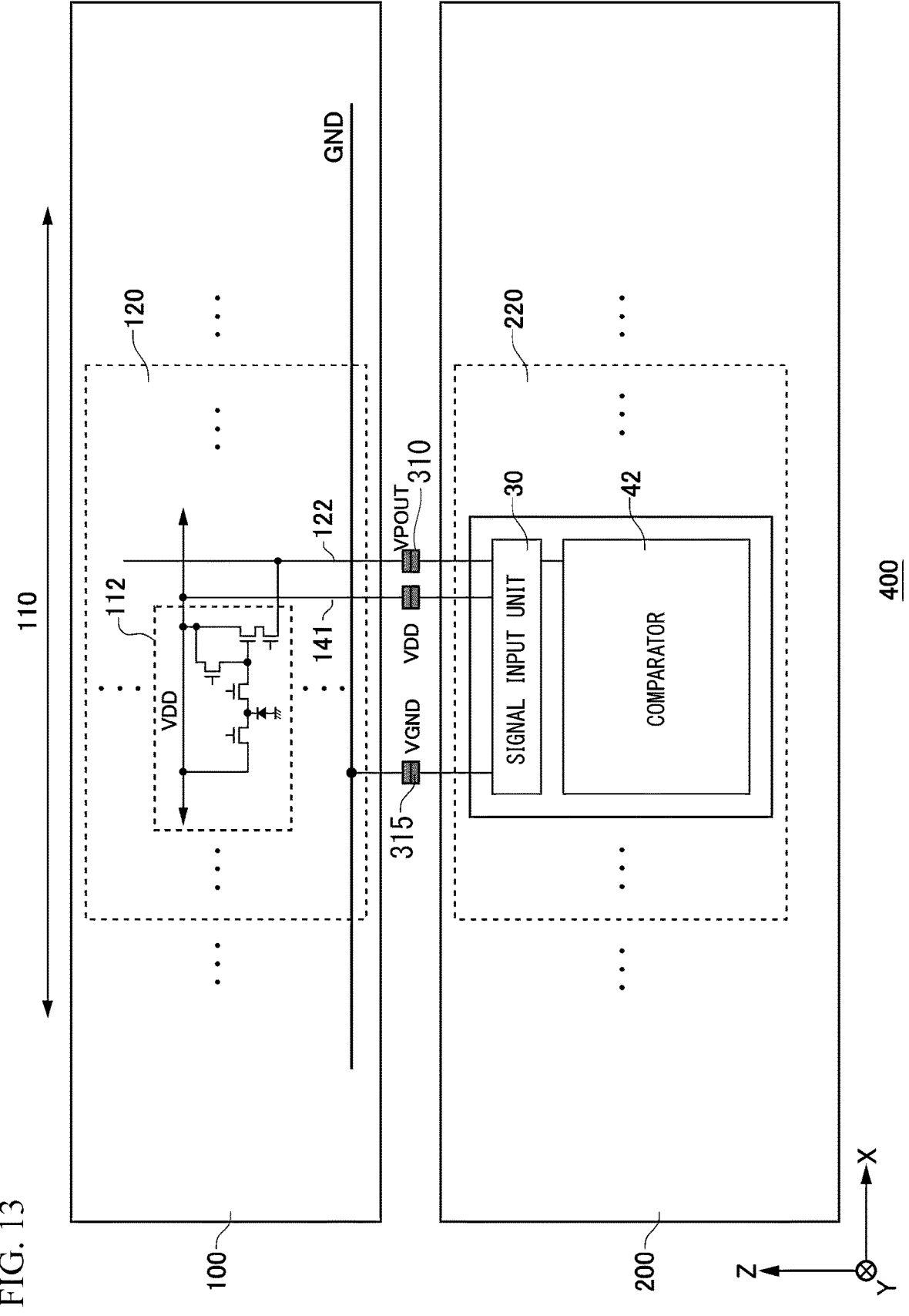
FIG. 13 is a diagram illustrating an example of a wiring method of the imaging element 400.

FIG. 13 is a diagram illustrating an example of a wiring method of the imaging element 400. In this example, wiring for inputting a pixel signal from the pixels 112 to the signal processing block 220 is described.

A ground line GND is set to a predetermined reference potential VGND. The ground line GND in this example is wired to cross the pixel chip 100 in the row direction. The ground line GND is connected to the signal input unit 30 of the signal processing block 220 via the reference potential joint 315.

The signal input unit 30 is connected to an output line of a voltage VPOUT and a power supply line of a voltage VDD via the signal joints 310. The signal input unit 30 is connected to the ground line GND set to the reference potential VGND. The signal input unit 30 outputs a pixel signal to the comparator 42 provided to correspond thereto. For example, n comparators 42 are arranged in the row direction.

Figure 14:
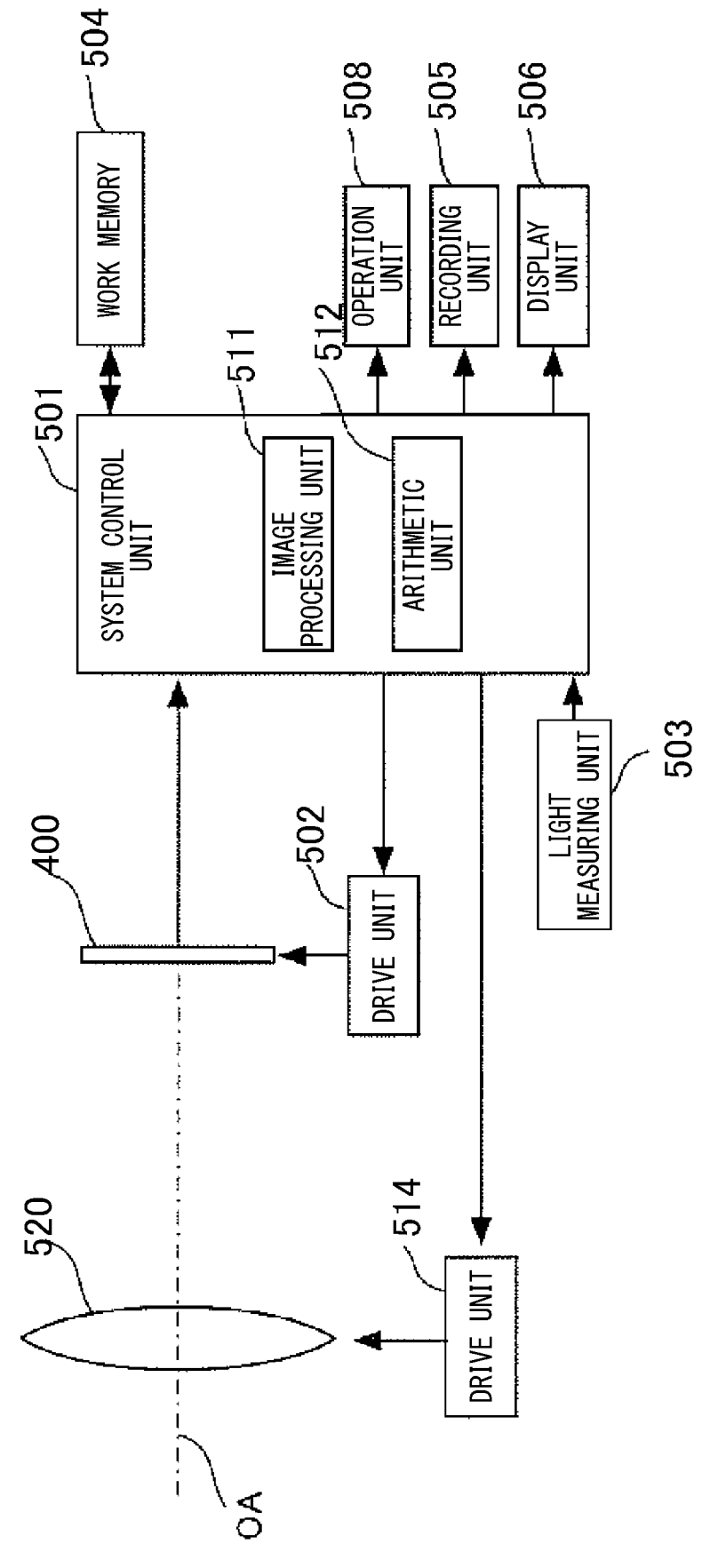
FIG. 14 is a block diagram illustrating an example of a configuration of an imaging device 500 according to an example.

FIG. 14 is a block diagram illustrating an example of a configuration of an imaging device 500 according to an embodiment. The imaging device 500 includes an imaging element 400, a system control unit 501, a drive unit 502, a light measuring unit 503, a work memory 504, a recording unit 505, a display unit 506, a drive unit 514, and an imaging lens 520.

The imaging lens 520 guides a subject luminous flux incident along an optical axis OA to the imaging element 400. The imaging lens 520 includes a plurality of optical lens groups and focuses a subject luminous flux from a scene in the vicinity of a focal plane thereof. The imaging lens 520 may be interchangeable lens that can be attached to and detached from the imaging device 500.

The imaging lens 520 is representatively illustrated using a virtual lens disposed in the vicinity of the pupil in FIG. 13.

The drive unit 514 drives the imaging lens 520. For example, the drive unit 514 changes an in-focus position by moving the optical lens group of the imaging lens 520. The drive unit 514 may control a light intensity of a subject luminous flux incident on the imaging element 400 by driving an iris diaphragm in the imaging lens 520.

The drive unit 502 includes a control circuit that performs electric charge accumulation control such as timing control and area control of the imaging element 400 in accordance with an instruction from the system control unit 501. An operation unit 508 receives an instruction from an imaging operator using a release button or the like.

The imaging element 400 guides a pixel signal to an image processing unit 511 of the system control unit 501. The image processing unit 511 generates image data by performing various imaging processes using the work memory 504 as a work space. For example, when image data in the form of a JPEG file is generated, the image processing unit generates a color image signal from a signal acquired using a Bayer array and then performs a compression process thereon. The generated image data is recorded in the recording unit 505 and is converted to a display signal and displayed on the display unit 506 for a preset time.

The light measuring unit 503 detects a luminance distribution of a scene before a series of imaging sequences for generating image data is performed. The light measuring unit 503 includes, for example, an AE sensor of about million pixels. An arithmetic unit 512 of the system control unit 501 receives an output from the light measuring unit 503 and calculates luminance for each area of a scene.

The arithmetic unit 512 determines a shutter speed, a diaphragm value, and ISO sensitivity on the basis of the calculated luminance distribution. The light measuring unit 503 may be shared by the imaging element 400. The arithmetic unit 512 performs various arithmetic operations for operating the imaging device 500. A part or whole of the drive unit 502 may be mounted in the imaging element 400. A part of the system control unit 501 may be mounted in the imaging element 400.

As described above, in the imaging element 400 according to this embodiment, the interval L1 between the first signal joint 310-1 and the second signal joint 310-2 is smaller than the interval L2 between the second signal joint 310-2 and the third signal joint 310-3. Accordingly, since signal lines connected to the first signal joints 310-1 and the second signal joints 310-2 can be collected in a narrower range, for example, in the column direction in comparison with signal lines connected to the second signal joints 310-2 and the third signal joints 310-3, it is possible to decrease a circuit area required in the column direction. Accordingly, it is possible to improve layout efficiency in the row direction (the X-axis direction) and the column direction (the Y-axis direction) of the first signal joints 310-1 and the second signal joints 310-2. Since the circuit area can be decreased, it is possible to decrease the size of the imaging element 400.

When the imaging element 400 is seen in the Z-axis direction, the first signal converter 40-1, the first signal joint 310-1, the second signal joint 310-2, and the second signal converter 40-2 are provided in this order. Accordingly, the first signal processing block 220-1 and the second signal processing block 220-2 can be arranged in a reversed manner (in a surface symmetric manner) with respect to a reference surface perpendicular to the column direction. Accordingly, it is possible to further improve layout efficiency of the signal processing blocks 220-1 and 220-2. In the boundary between the signal processing blocks 220-1 and 220-2, the same configurations are disposed adjacent to each other.

The constituents of the signal processing blocks 220 are formed in a well region provided in a semiconductor substrate. The well region is separated according to handled signals. The well region is separated depending on whether a power source to be used is a digital power source or an analog power source. The signal converters 40 may be separated from a region using another analog power source from the viewpoint of noise when the same analog sources are used. A well separation region with an interval based on a manufacturing process rule is required to separate the well region.

In the imaging element 400 according to this embodiment, a pixel current source 221 which is an analog power source and the storage unit 44 or the signal output unit 50 requiring a digital power source can be separated by reversed arrangement. By collecting the first signal joints 310-1 and the second signal joints 310-2 such that the pixel current source 221 and the storage unit 44 or the signal output unit 50 are separated, it is possible to omit the well separation region with an interval based on the manufacturing process rule. Accordingly, since the circuit area can be decreased, it is possible to decrease the size of the imaging element 400.

In the signal processing block 220 according to this embodiment, a well region for forming the level shift unit 14 and the pixel drive unit 20 is separated from the other well regions. For example, by providing the level shift unit 14 and the pixel drive unit 20 in an L-shape, the well region of the level shift unit 14 and the pixel drive unit 20 can be shared. Since the well separation region can be omitted by sharing the well region, it is possible to improve layout efficiency.

The signal lines for transferring an analog signal and the signal lines for transferring a digital signal can be physically separated from each other. Accordingly, it is possible to reduce an influence of noise of the digital signal on the analog signal. In the imaging element 400 according to this embodiment, the signal input unit 30 to which an analog signal is input and the signal output unit 50 which outputs a digital signal are physically separated by reversed arrangement. By collecting the signal lines connected to the first signal joints 310-1 and the second signal joints 310-2 such that the signal input unit 30 and the signal output unit 50 can be physically separated, it is possible to reduce an influence of noise of the digital signal on the analog signal.

The first signal processing block 220-1 includes a plurality of first signal converters 40-1 in the row direction. Accordingly, it is possible to process signals from a plurality of first pixels 112-1 using the plurality of first signal converters 40-1 for a shorter time.

The first pixel block 120-1 includes a plurality of first pixels 112-1. Accordingly, it is possible to output more signals from the plurality of first pixels 112-1 in the first pixel block 120-1.

With the imaging device 500 according to this embodiment, it is possible to constitute an imaging device 500 using the imaging element 400 of which the layout efficiency has been improved.

The imaging element 400 may not include the reference potential joints 315-1, 315-2, and 315-3. In this case, only the signal joints 310-1, 310-2, and 310-3 are arranged in the column direction.

The configuration of the imaging element 400 according to this embodiment can be modified in various forms as will be described below.

Figure 15:
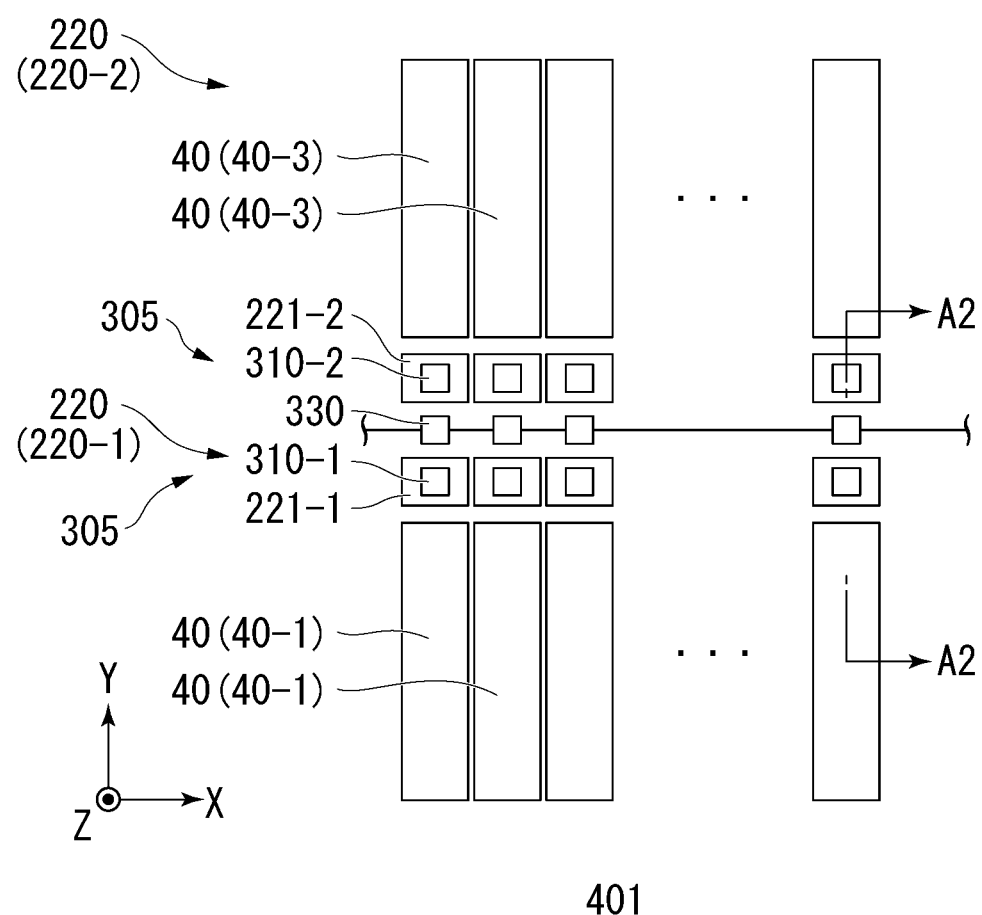
FIG. 15 is a plan view illustrating an example of a signal processing block 220 of an imaging element 401 according to a first modified example of the embodiment of the present invention.
Figure 16:
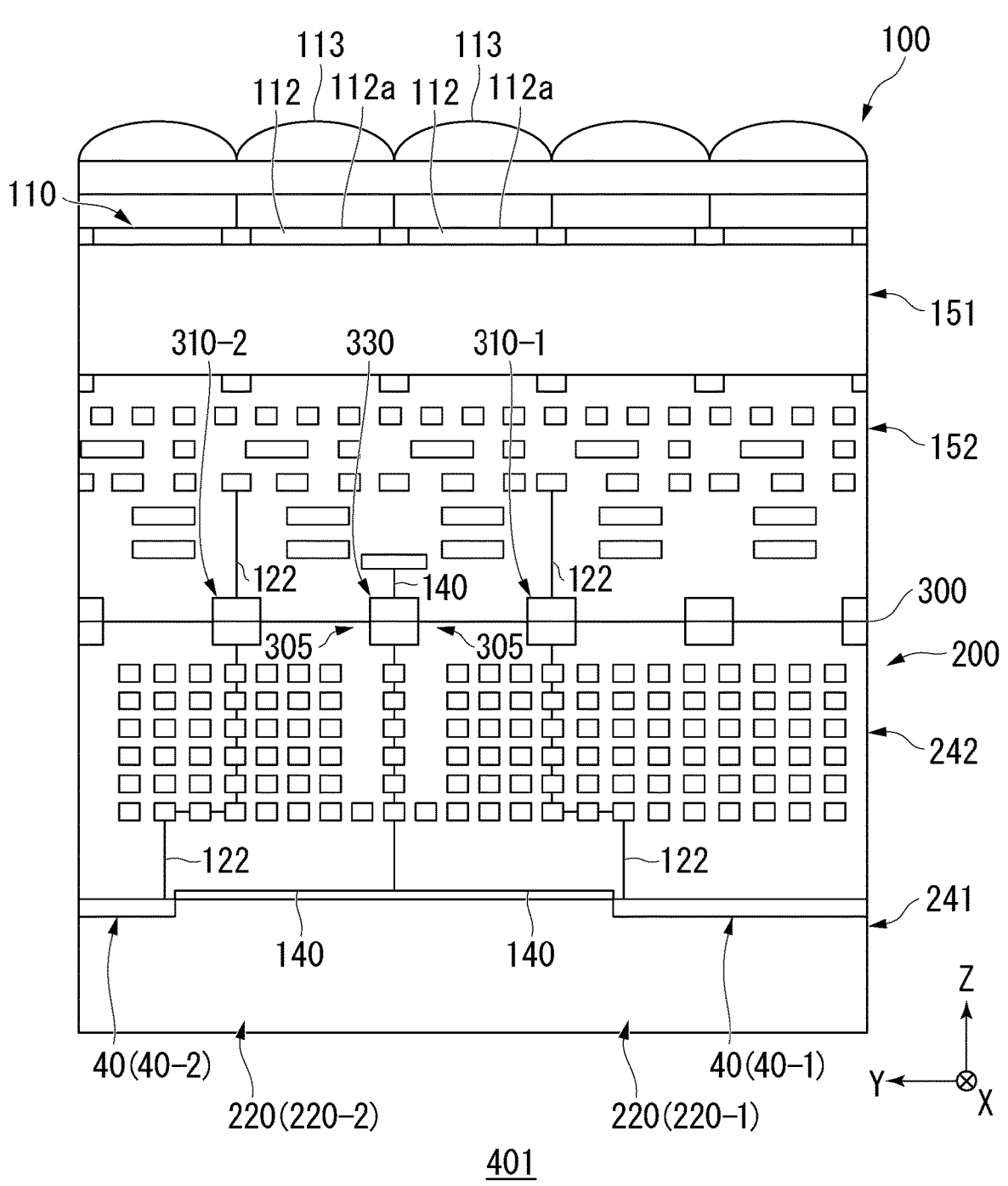
FIG. 16 is a sectional view along line A2-A2 in FIG. 15.

Like an imaging element 401 according to a first modified example illustrated in FIGS. 15 and 16, the first reference potential joint 315-1 and the second reference potential joint 315-2 in the imaging element 400 according to the embodiment may be unified as a reference potential joint 330. The reference potential joint 330 has the same configuration as the first reference potential joint 315-1.

The reference potential joint 330 is used for a reference potential of the first signal processing block 220-1 and a reference potential of the second signal processing block 220-2. The reference potential joint 330 joins the first substrate 100 and the second substrate 200.

In the imaging element 401 according to the first modified example, the well region of the reference potential joint 330 can be decreased. Accordingly, it is possible to decrease the size of the imaging element 401 in the column direction and to decrease a circuit area of the imaging element 401.

Figure 17:
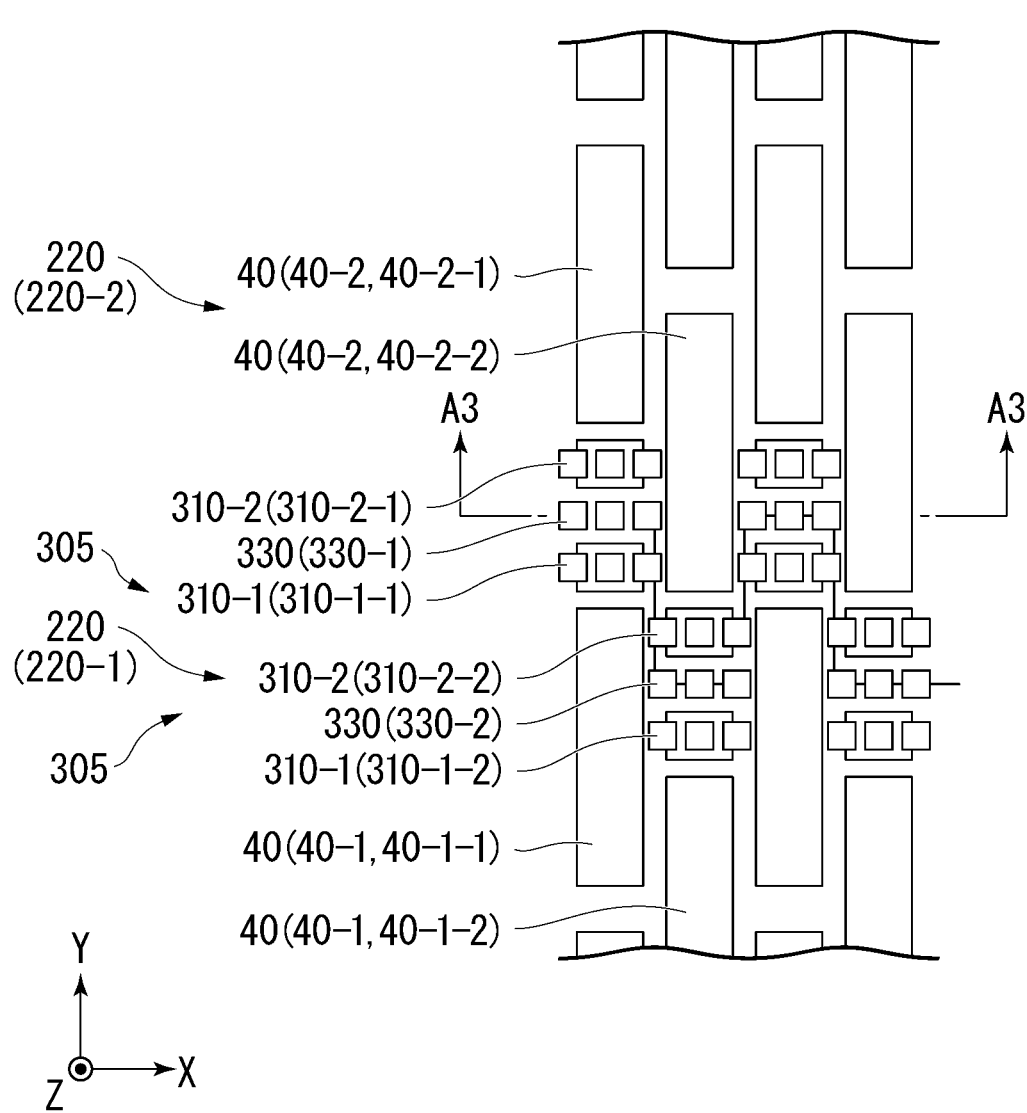
FIG. 17 is a plan view illustrating an example of a signal processing block 220 of an imaging element 402 according to a second modified example of the embodiment of the present invention.
Figure 18:
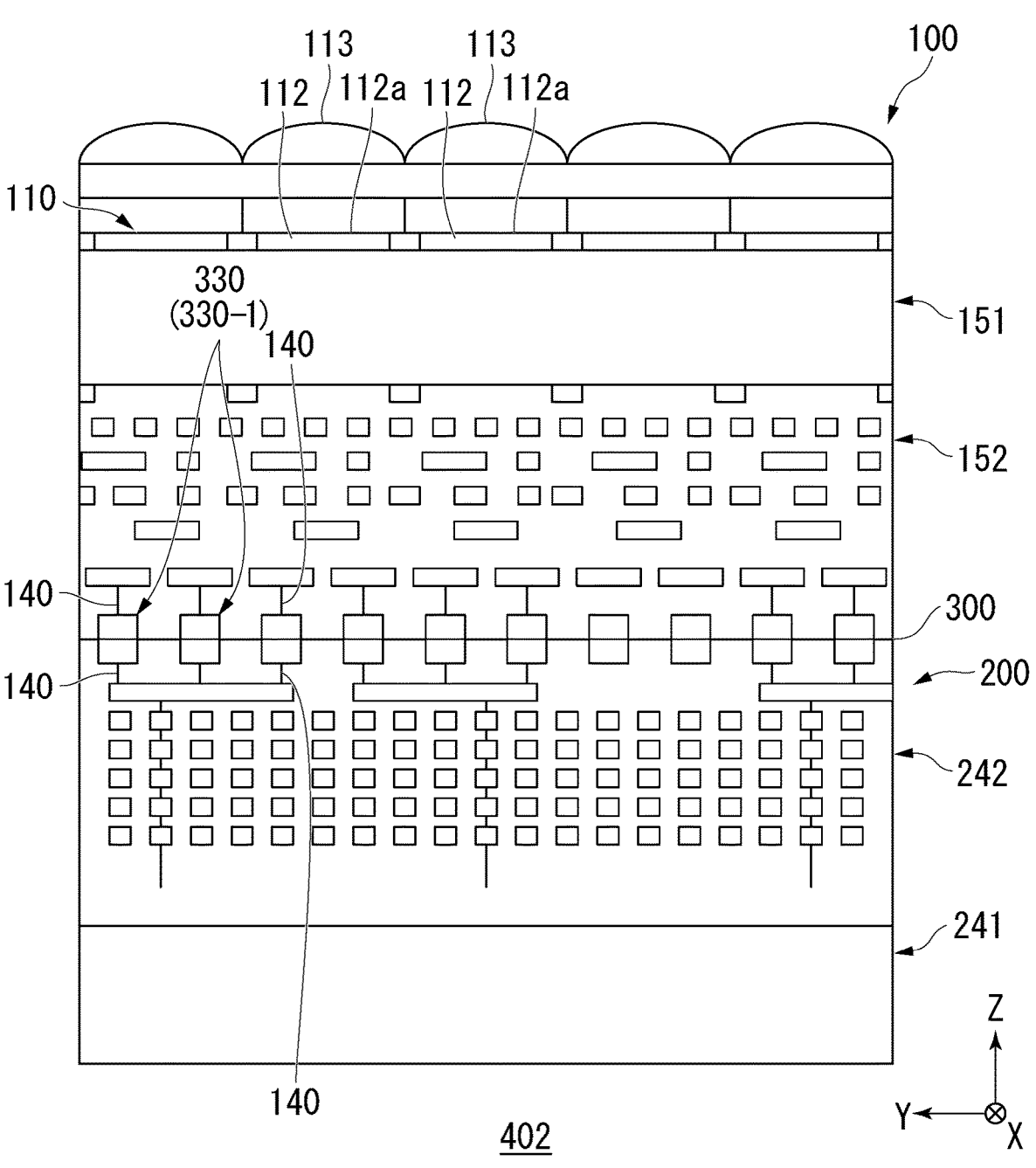
FIG. 18 is a sectional view along line A3-A3 in FIG. 17.

An imaging element 402 according to a second modified example illustrated in FIGS. 17 and 18 will be described below. In the imaging element 402, out of a pair of first signal converters 40-1 adjacent to each other in the row direction, one first signal converter 40-1 is referred to as a first signal converter 40-1-1, and the other first signal converter 40-1 is referred to as a first signal converter 40-1-2.

Similarly, out of a pair of second signal converters 40-2 adjacent to each other in the row direction, one second signal converter 40-2 is referred to as a second signal converter 40-2-1, and the other second signal converter 40-2 is referred to as a second signal converter 40-2-2.

The first signal joint 310-1 for the first signal converter 40-1-1 is referred to as a first signal joint 310-1-1, and the second signal joint 310-2 for the second signal converter 40-2-1 is referred to as a second signal joint 310-2-1. A reference potential joint 330 shared by the first signal converter 40-1-1 and the second signal converter 40-2-1 is referred to as a reference potential joint 330-1.

The first signal joint 310-1 for the first signal converter 40-1-2 is referred to as a first signal joint 310-1-2, and the second signal joint 310-2 for the second signal converter 40-2-2 is referred to as a second signal joint 310-2-2. A reference potential joint 330 shared by the first signal converter 40-1-2 and the second signal converter 40-2-2 is referred to as a reference potential joint 330-2.

A plurality of first signal joints 310-1-1, a plurality of second signal joints 310-2-1, and a plurality of reference potential joints 330-1 are arranged with an interval in the row direction.

A plurality of first signal joints 310-1-2, a plurality of second signal joints 310-2-2, and a plurality of reference potential joints 330-2 are arranged with an interval in the row direction.

A plurality of joints 310-1-1, 310-2-1, and 330-1 for the signal converters 40-1-1 and 40-2-1 and a plurality of joints 310-1-2, 310-2-2, and 330-2 for the signal converters 40-1-2 and 40-2-2 are arranged with a positional shift in the column direction (such that they do not overlap in the column direction). More specifically, for example, the plurality of first signal joints 310-1-1 and the plurality of first signal joints 310-1-2 are arranged with a positional shift in the column direction.

The signal converters 40-1 and 40-2 and the joints 310-1, 310-2, and 330 are formed in different layers in the Z-axis direction. Accordingly, even when the signal converters 40-1 and 40-2 and the joints 310-1, 310-2, and 330 seem to interfere with each other in the plan view illustrated in FIG. 17, they do not interfere with each other actually. The constituents do not interference with each other in the signal converters 40-1 and 40-2, and the constituents do not interference with each other in the joints 310-1, 310-2, and 330.

In the imaging element 402 according to the second modified example having the aforementioned configuration, the plurality of first signal joint 310-1-1 and the plurality of first signal joint 310-1-2 are arranged with a positional shift in the column direction. Accordingly, the first signal pads 311-1 and the second signal pads 312-1 constituting the signal joints 310-1-1 and 310-1-2 can be formed in a shape with a large width in the row direction. Accordingly, for example, when the first signal pad 311-1 is shifted with respect to the second signal pad 312-1 in the row direction at the time of joining the substrates 100 and 200, parts facing both pads 311-1 and 312-1 are likely to remain. Accordingly, it is possible to reliably connect both pads 311-1 and 312-1 using a first signal connection member and to improve a joint yield of both pads 311-1 and 312-1.

In the imaging element 402 according to the second modified example, the first signal joint 310-1-1 is provided for the first signal converter 40-1-1, and the second signal joint 310-2-1 is provided for the second signal converter 40-2-1. One reference potential joint 330-1 is provided for both the first signal converter 40-1-1 and the second signal converter 40-2-1.

The same is true of the first signal joint 310-1-2, the second signal joint 310-2-2, and the reference potential joint 330-2.

Figure 19:
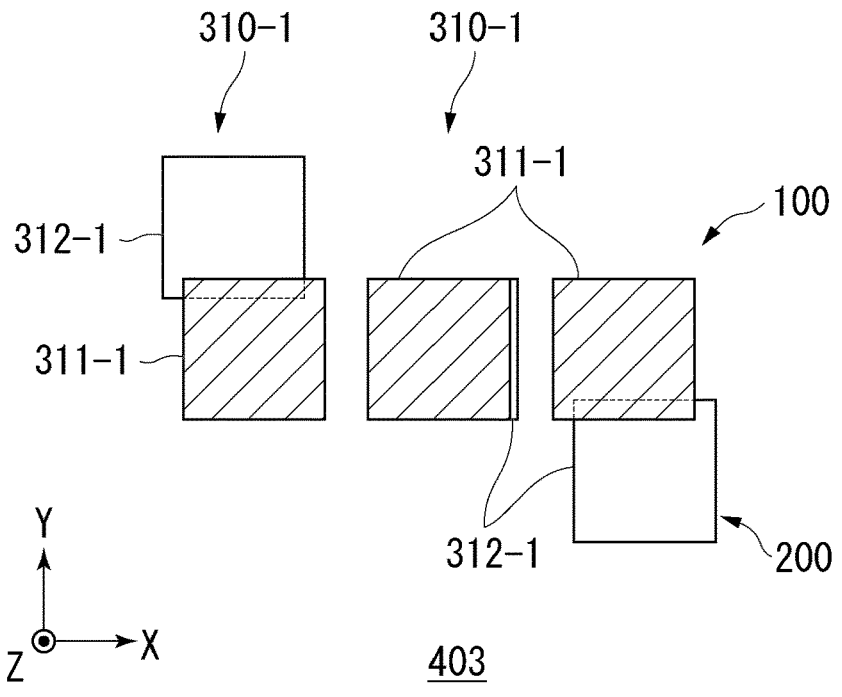
FIG. 19 is a plan view illustrating arrangement of a plurality of first signal joints 310-1 in an imaging element 403 according to a third modified example of the embodiment of the present invention.

In an imaging element 403 according to a third modified example illustrated in FIG. 19, arrangement of a plurality of first signal joints 310-1 is different from that in the imaging element 402 according to the second modified example.

A plurality of first signal pads 311-1 are arranged with an interval on a reference line M1 extending in the row direction.

A plurality of second signal pads 312-1 are arranged with an interval in the row direction. Among the plurality of signal pads 311-1, one second signal pad 312-1 and another second signal pad 312-1 out of the plurality of second signal pads 312-1 are arranged with a positional shift in the column direction less than a length in the column direction of the first signal pad 311-1. In the imaging element 403 according to this example, a pair of second signal pads 312-1 adjacent to each other in the row direction out of the plurality of second signal pads 312-1 are arranged with a positional shift in the column direction less than a length in the column direction of the first signal pad 311-1. That is, the first signal pad 311-1 is likely to come into contact with at least one of a pair of second signal pads 312-1 adjacent to each other in the row direction.

In this modified example, a plurality of first signal pads 311-1 are arranged with a tilt with respect to the row direction such that they proceed gradually toward a second end opposite to the first end in the column direction as they proceeds toward a second end opposite to the first end in the row direction.

In the imaging element 403 according to the third modified example having the aforementioned configuration, for example, when the second substrate 200 do not shift in the row direction and the column direction with respect to the first substrate 100, it is assumed that the plurality of first signal pads 311-1 of the first substrate 100 join to the plurality of second signal pads 312-1 of the second substrate 200 as illustrated in FIG. 19.

Figure 20:
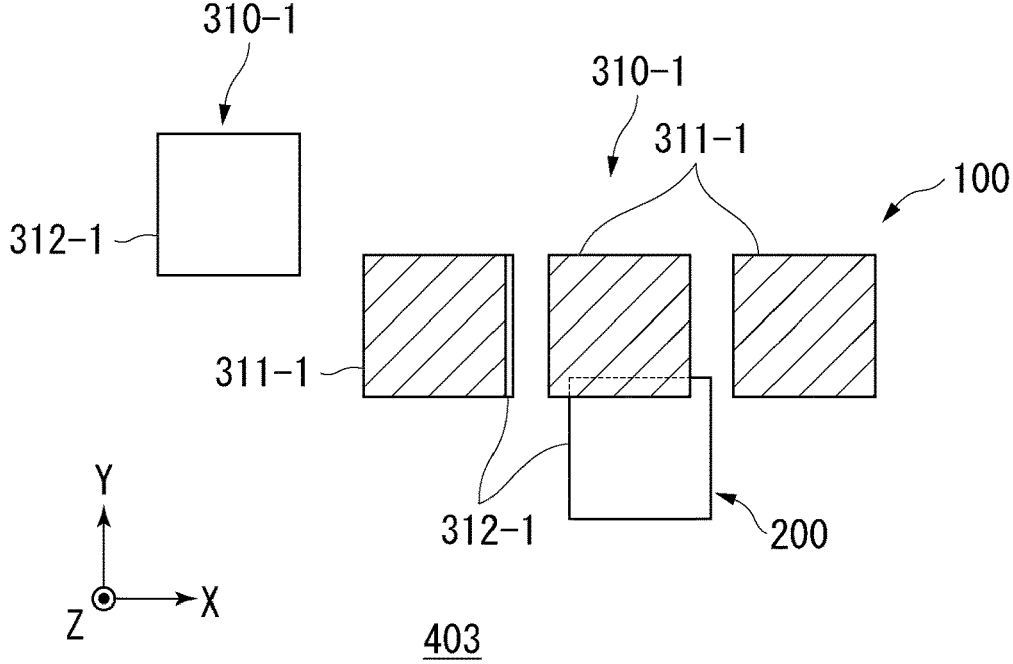
FIG. 20 is a plan view illustrating an example of arrangement of a plurality of first signal joints 310-1 when the first substrate 100 is misaligned from the second substrate 200.

For example, even when the first substrate 100 shifts in the row direction with respect to the second substrate 200 from the state illustrated in FIG. 19 as illustrated in FIG. 20, a part of the plurality of second signal pads 312-1 and a part of the plurality of first signal pads 311-1 join to each other.

Figure 21:
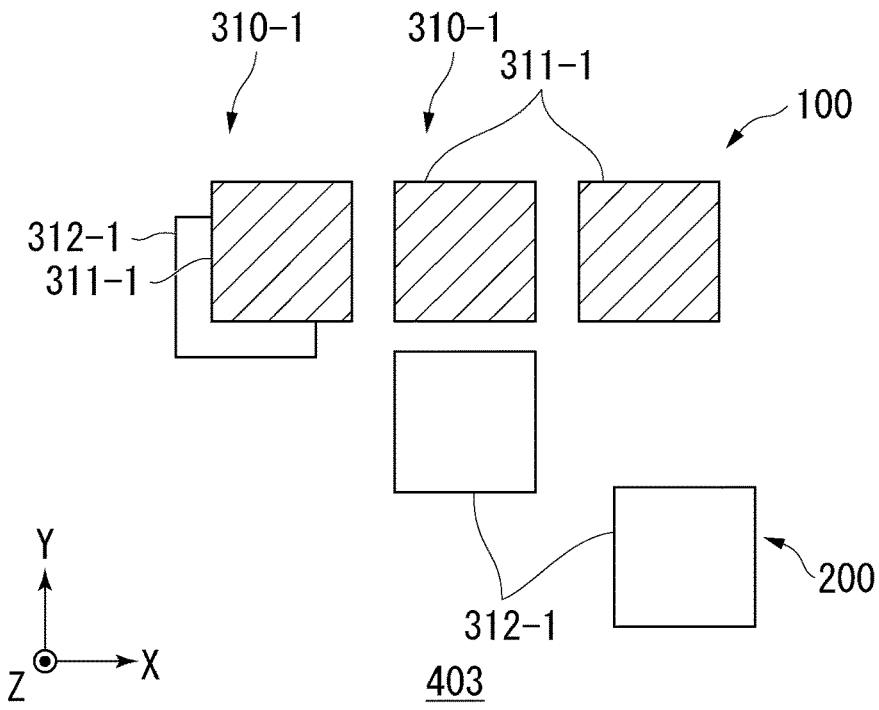
FIG. 21 is a plan view illustrating another example of arrangement of a plurality of first signal joints 310-1 when the first substrate 100 is misaligned from the second substrate 200.

For example, even when the first substrate 100 shifts in the column direction with respect to the second substrate 200 from the state illustrated in FIG. 19 as illustrated in FIG. 21, a part of the plurality of second signal pads 312-1 and a part of the plurality of first signal pads 311-1 join to each other.

Figure 22:
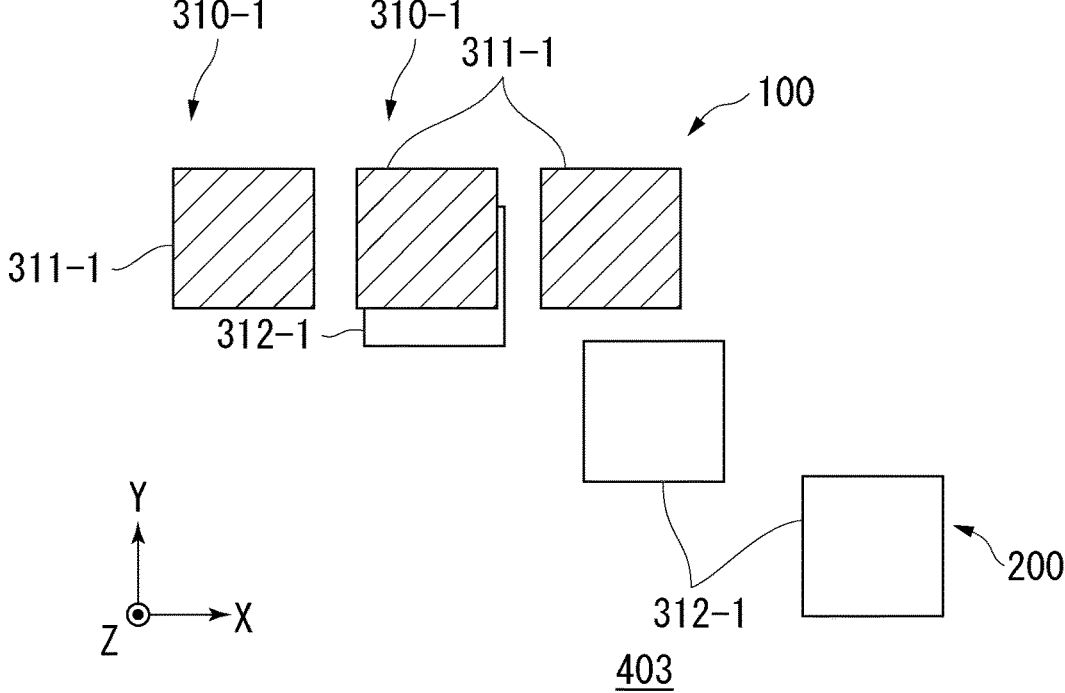
FIG. 22 is a plan view illustrating another example of arrangement of a plurality of first signal joints 310-1 when the first substrate 100 is misaligned from the second substrate 200.

For example, even when the first substrate 100 shifts in the row direction and the column direction with respect to the second substrate 200 from the state illustrated in FIG. 19 as illustrated in FIG. 22, a part of the plurality of second signal pads 312-1 and a part of the plurality of first signal pads 311-1 join to each other.

In the imaging element 403 according to the third modified example having the aforementioned configuration, even when the first substrate 100 shifts in the column direction with respect to the second substrate 200, it is possible to more reliably connect the plurality of second signal pads 312-1 and the plurality of first signal pads 311-1.

The positions in the column direction of the plurality of first signal pads 311-1 may be the same.

Figure 23:
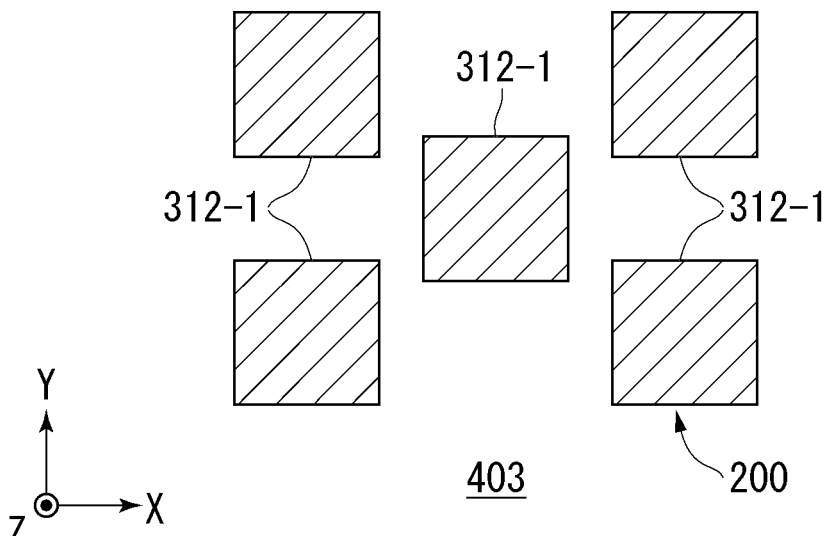
FIG. 23 is a plan view illustrating another arrangement of a plurality of second signal pads 312-1 in a plurality of first signal joints 310-1.

In the imaging element 403 according to the third modified example, the plurality of second signal pads 312-1 may be arranged as illustrated in FIG. 23.

In this modified example, some of the plurality of second signal pads 312-1 are arranged with a tilt with respect to the row direction such that they proceed gradually toward the second end in the column direction as they proceeds toward the second end in the row direction. The other of the plurality of second signal pads 312-1 are arranged with a tilt with respect to the row direction such that they proceed toward the first end in the column direction as they proceeds toward the second end in the row direction.

It is assumed that the first pads are the first signal pads 311-1 and the second pads are the second signal pads 312-1. However, the first pads may be the second signal pads 312-1 and the second pads may be the first signal pads 311-1.

Figure 24:
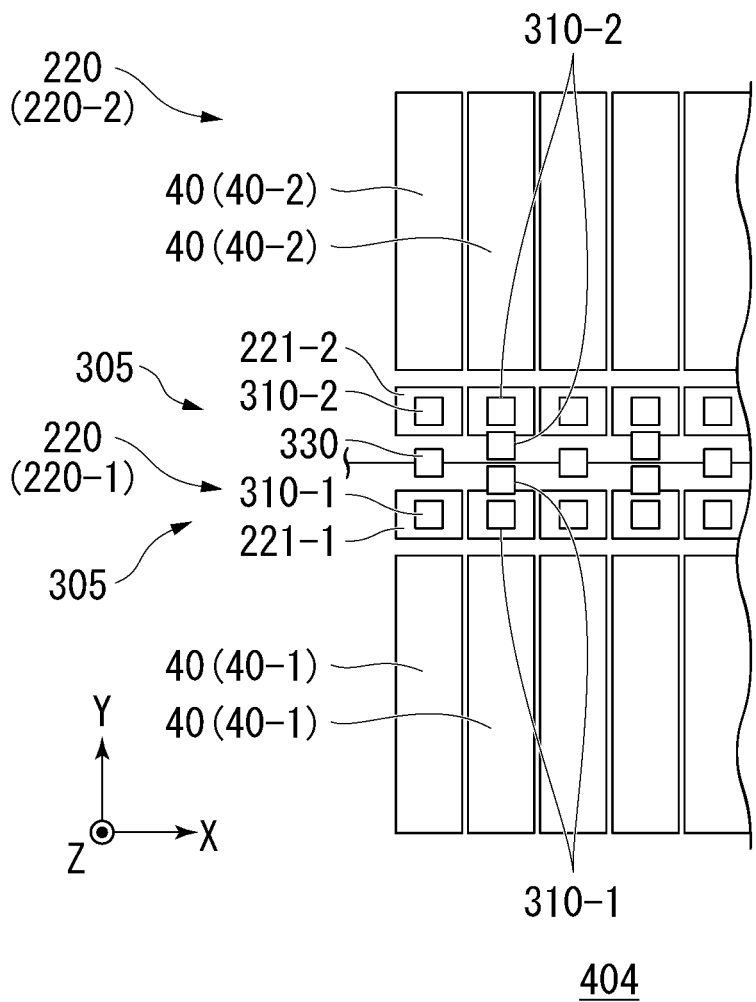
FIG. 24 is a plan view illustrating an example of a signal processing block 220 of an imaging element 402 according to a fourth modified example of the embodiment of the present invention.

In an imaging element 404 according to a fourth modified example illustrated in FIG. 24, a single reference potential joint 330 is provided for a plurality of first signal converters 40-1 adjacent to each other in the row direction.

More specifically, in the imaging element 404, a single reference potential joint 330 is provided for both a pair of first signal converters 40-1 and a pair of second signal converters 40-2 adjacent to each other in the row direction.

The reference potential joint 330 is disposed between the signal converters 40-1 and 40-2 located at the first end in the row direction out of the pair of first signal converters 40-1 and the pair of second signal converters 40-2. The reference potential joint 330 is disposed between odd-numbered signal converters 40-1 and 40-2 from the first end in the row direction (hereinafter simply referred to as odd-numbered). That is, the reference potential joint 330 is disposed for every two groups of the signal converters 40-1 and 40-2.

The imaging element 404 includes a plurality of first signal joints 310-1 for each even-numbered first signal converter 40-1 from the first end in the row direction (hereinafter simply referred to as even-numbered) and a plurality of second signal joints 310-2 for each even-numbered second signal converter 40-2. The plurality of first signal joints 310-1 are arranged with an interval in the column direction, and the plurality of second signal joints 310-2 are arranged with an interval in the column direction.

The even-numbered signal converters 40-1 and 40-2 are connected to the reference potential joint 330 via a line which is not illustrated.

In the imaging element 404 according to the fourth modified example having the aforementioned configuration, a single reference potential joint 330 is provided for a pair of signal converters 40-1 and 40-2 adjacent to each other in the row direction. Accordingly, for example, a space for disposing a plurality of signal joints 310-1 and 310-2 can be secured between the signal converters 40-1 and 40-2.

A plurality of signal joints 310-1 and 310-2 are arranged between a group of the even-numbered signal converters 40-1 and 40-2. Accordingly, even when the first signal pad 311-1 shifts in the column direction with respect to the second signal pad 312-1, parts of both pads 311-1 and 312-1 facing each other are likely to remain. Accordingly, it is possible to reliably connect both pads 311-1 and 312-1 using a signal connection member and to improve a joining yield of both pads 311-1 and 312-1.

By arranging the reference potential joints 330 at equal intervals in the row direction, it is possible to equalize impedances of lines connected to the reference potential joints 330.

Figure 25:
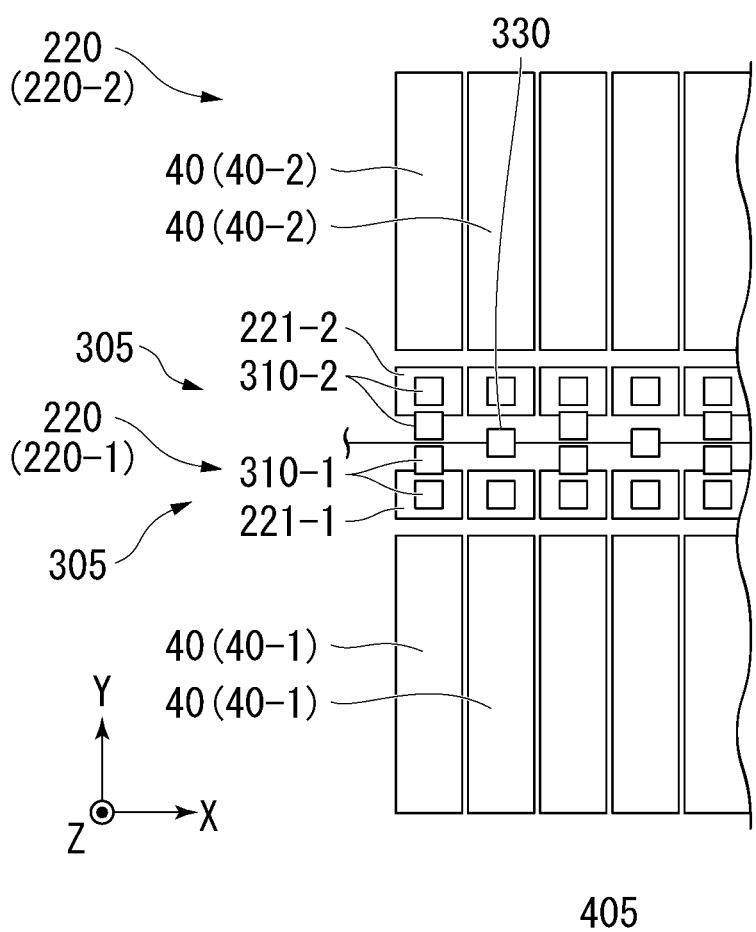
FIG. 25 is a plan view illustrating an example of a signal processing block 220 of an imaging element 405 according to a fifth modified example of the embodiment of the present invention.

In the imaging element 404 according to the fourth modified example, like an imaging element 405 according to a fifth modified example illustrated in FIG. 25, a plurality of signal joints 310-1 and 310-2 for the odd-numbered signal converters 40-1 and 40-2 may be provided, and the reference potential joint 330 may be disposed between the even-numbered signal converters 40-1 and 40-2.

The reference potential joint 330 may be provided for every three groups of the signal converters 40-1 and 40-2.

Figure 26:
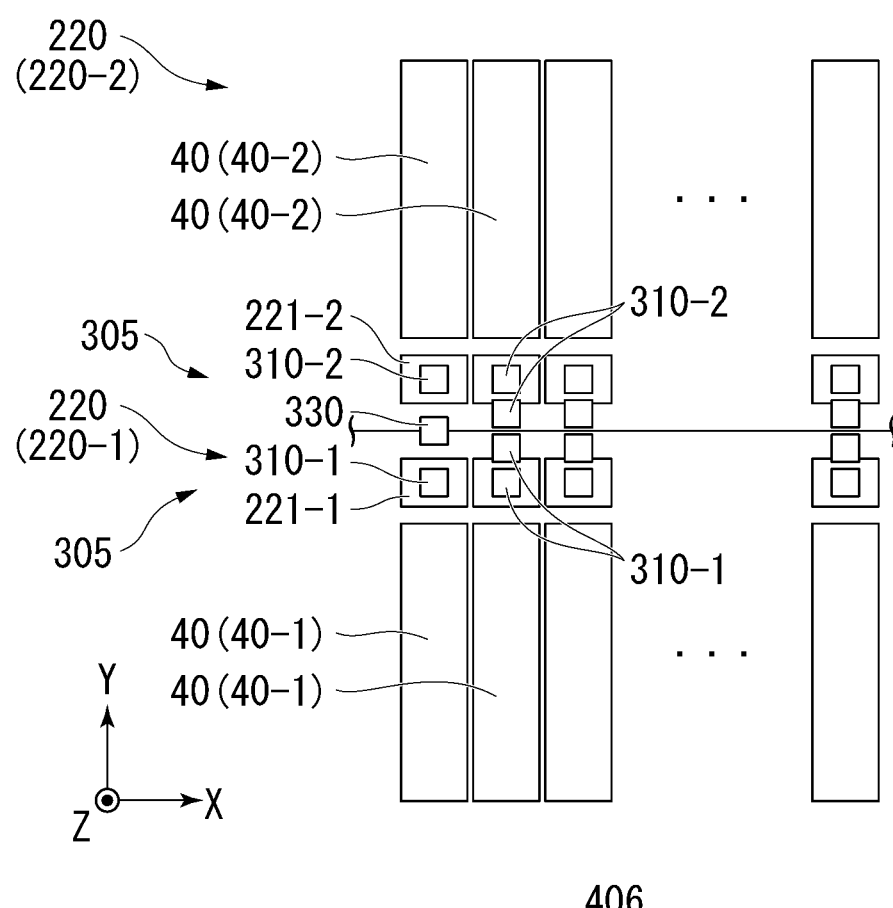
FIG. 26 is a plan view illustrating an example of a signal processing block 220 of an imaging element 406 according to a sixth modified example of the embodiment of the present invention.

In an imaging element 406 according to a sixth modified example illustrated in FIG. 26, the reference potential joint 330 is disposed between one of a plurality of first signal converters 40-1 and one of a plurality of second signal converters 40-2. More specifically, the reference potential joint 330 is disposed between a group of the signal converters 40-1 and 40-2 at the first end in the row direction.

A plurality of first signal joints 310-1 and a plurality of second signal joints 310-2 are provided between the signal converters 40-1 and 40-2 between which the reference potential joint 330 is not disposed.

In the imaging element 406 according to the sixth modified example having the aforementioned configuration, since the first signal joints 310-1 and the second signal joints 310-2 are provided between the signal converters 40-1 and 40-2 between which the reference potential joint 330 is not disposed, the same effects as in the imaging element 404 according to the fourth modified example can be achieved.

The position of the group of the signal converters 40-1 and 40-2 between which the reference potential joint 330 is not disposed is not particularly limited.

Figure 27:
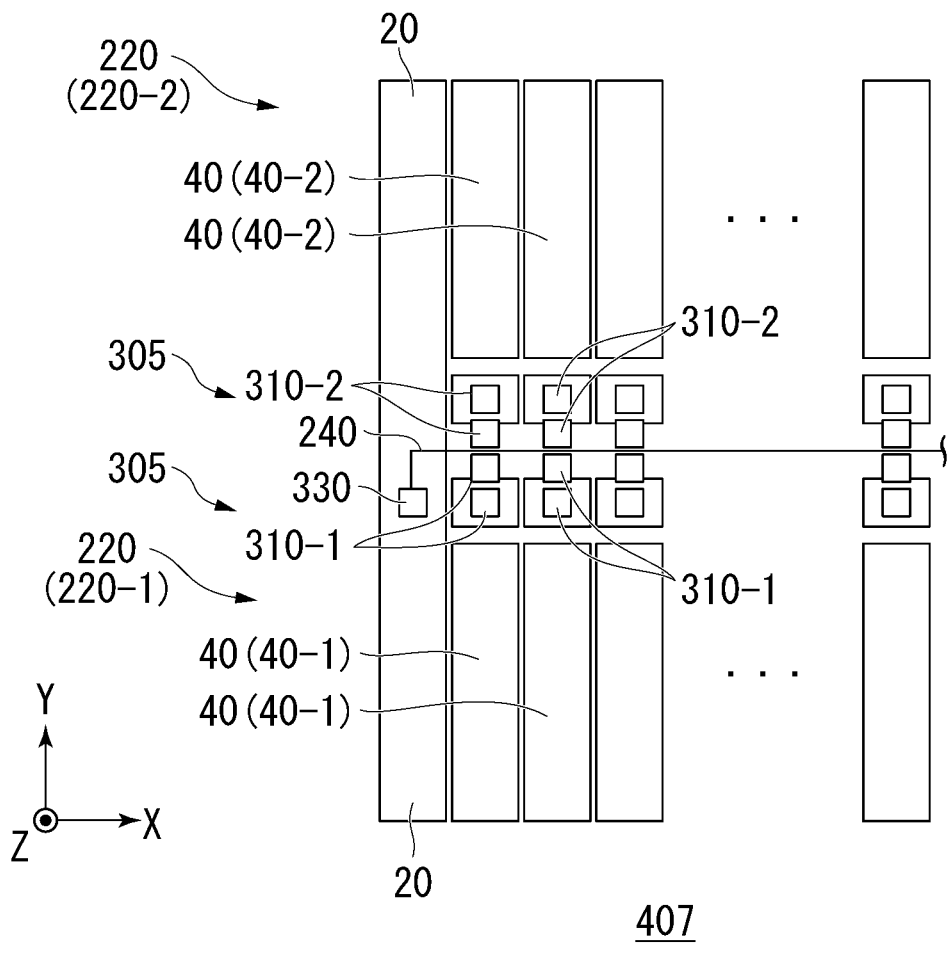
FIG. 27 is a plan view illustrating an example of a signal processing block 220 of an imaging element 407 according to a seventh modified example of the embodiment of the present invention.

In an imaging element 407 according to a seventh modified example illustrated in FIG. 27, when the imaging element 407 is seen in the Z-axis direction, the reference potential joint 330 is disposed at a position on the joint surface 300 not overlapping the first signal converters 40-1 in the row direction. In this example, the reference potential joint 330 is disposed at a position on the joint surface 300 overlapping the pixel drive unit 20. The reference potential joint 330 is disposed at a position shifted in the column direction from a position between the group of the signal converters 40-1 and 40-2.

The reference potential joint 330 is connected to a reference potential line 240. The reference potential line 240 extends in the row direction between the first signal converter 40-1 and the second signal converter 40-2. Between the group of the signal converters 40-1 and 40-2, the reference potential joint 330 is not disposed but a plurality of first signal joints 310-1 and a plurality of second signal joints 310-2 are disposed.

The first signal processing blocks 220-1 are arranged in the row direction. The first signal processing blocks 220-1 adjacent to each other in the row direction are connected to each other via the reference potential line 240.

In the imaging element 407 according to the seventh modified example having the aforementioned configuration, when the imaging element 407 is seen in the Z-axis direction, the reference potential joint 330 is disposed at a position on the joint surface 300 not overlapping the first signal converters 40-1 in the row direction. Accordingly, for example, a space for disposing a plurality of signal joints 310-1 and 310-2 can be secured between the signal converters 40-1 and 40-2.

It is also possible to improve a joining yield between two pads 311-1 and 312-1.

Figure 28:
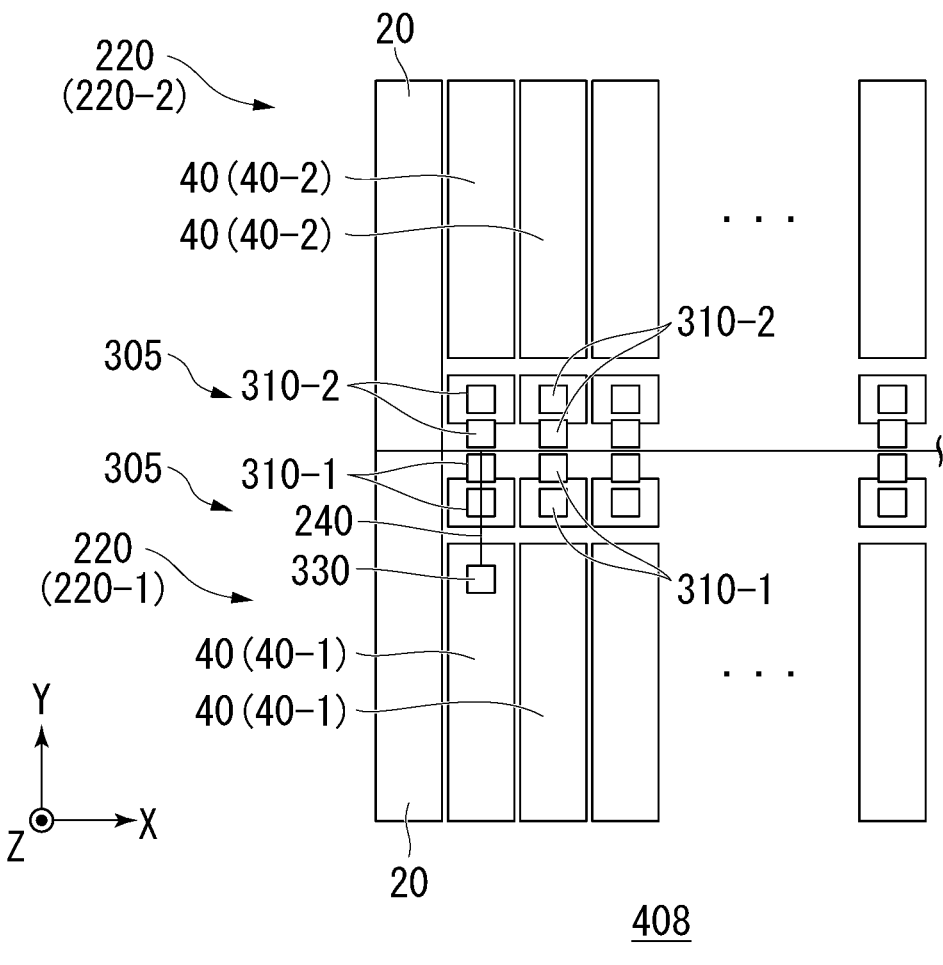
FIG. 28 is a plan view illustrating an example of a signal processing block 220 of an imaging element 408 according to an eighth modified example of the embodiment of the present invention.

Similarly to the imaging element 407 according to the seventh modified example, in an imaging element 408 according to an eighth modified example illustrated in FIG. 28, the reference potential joint 330 may be disposed at a position on the joint surface 300 overlapping the first signal converter 40-1 when the imaging element 408 is seen in the Z-axis direction.

In the imaging element 408 according to the eighth modified example having the aforementioned configuration, the same effects as in the imaging element 407 according to the seventh modified example can be achieved.

Figure 29:
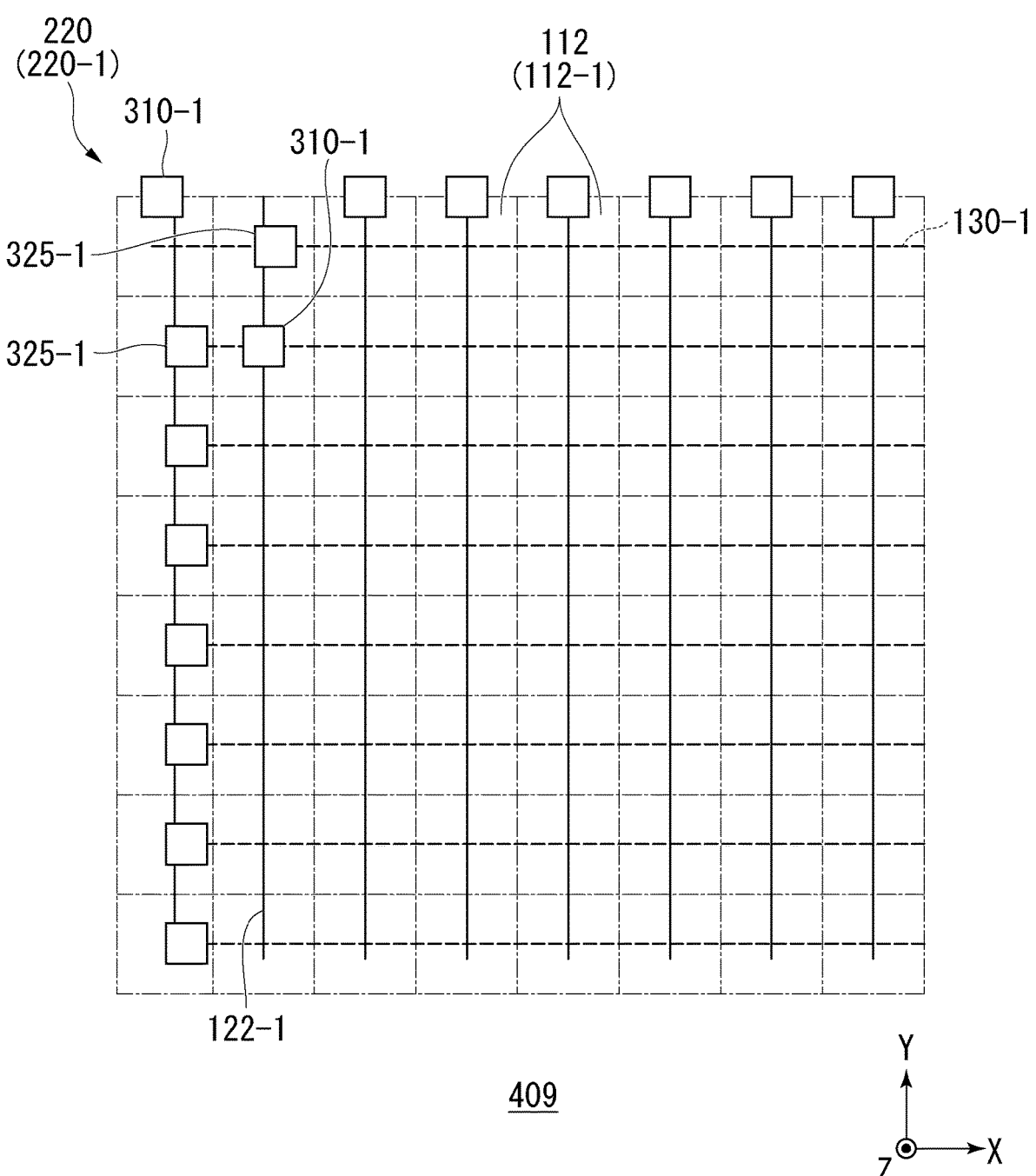
FIG. 29 is a plan view schematically illustrating an example of arrangement of first signal joints 310-1 and first control joints 325-1 in an imaging element 409 according to a ninth modified example of the embodiment of the present invention.

In an imaging element 409 according to a ninth modified example illustrated in FIG. 29, the positions of the first signal joint 310-1 and the first control joint 325-1 disposed at the first end in the row direction and at the first end in the column direction in the imaging element 400 according to the embodiment are shifted.

Specifically, when the imaging element 409 is seen in the Z-axis direction, the first control joint 325-1 disposed at the first end in the column direction is disposed at a position overlapping the first pixel 112-1 which is located secondly from the first end in the row direction and which is at the first end in the column direction.

In this example, when the imaging element 409 is seen in the Z-axis direction, the first signal joint 310-1 which is located secondly from the first end in the row direction is disposed at a position overlapping the first pixel 112-1 which is located secondly from the first end in the column direction and which is located secondly from the first end in the row direction.

A length by which the positions of the joints 310-1 and 325-1 are shifted is preferably as small as possible. That is, the shifting length is preferably limited to the length in the row direction and the length in the column direction of one first pixel 112-1.

For example, when the size of the first pixel 112-1 is decreased, only one joint can be disposed at a position overlapping one first pixel 112-1 when the imaging element 409 is seen in the Z-axis direction.

In this case, in the imaging element 409 according to the ninth modified example, only the first signal joint 310-1 or the first control joint 325-1 can be disposed at a position overlapping one first pixel 112-1.

When the imaging element 409 is seen in the Z-axis direction, the first control joint 325-1 disposed at the first end in the column direction may not be disposed at the position overlapping the first pixel 112-1 which is located secondly from the first end in the row direction, but the first signal joint 310-1 disposed at the first end in the row direction may be disposed at a position overlapping the first pixel 112-1 which is located secondly from the first end in the column direction and which is at the first end in the row direction.

While an embodiment of the present invention has been described above with reference to the drawings, a specific configuration is not limited to the embodiment and includes modifications, combinations, and deletions without departing from the gist of the present invention.

For example, in the embodiment and the modified examples, the imaging element may not include the reference potential joints 315-1, 315-2, and 330 and the load current sources 221-1 and 221-2.

REFERENCE SIGNS LIST

40-1 First signal converter
40-2 Second signal converter
40-3 Third signal converter
100 First substrate
112-1 First pixel
112a Light receiving surface
120-1 First pixel block
120-2 Second pixel block
120-3 Third pixel block
200 Second substrate
220-1 First signal processing block 220-2 Second signal processing block
220-3 Third signal processing block
300 Joint surface
310-1 First signal joint
310-2 Second signal joint
310-3 Third signal joint
311-1 First signal pad (first pad)
312-1 Second signal pad (second pad)
325-1 First control joint
330 Reference potential joint
400, 401, 402, 403, 404, 405, 406, 407, 408, 409 Imaging
   element
500 Imaging device
L1, L2 Interval

The invention claimed is:

1. An imaging element comprising:
a first substrate including (i) a first pixel block having a
   first pixel including a first photoelectric converter that
   converts light into an electric charge, (ii) a second pixel
   block having a second pixel including a second pho-
   toelectric converter that converts light into an electric
   charge, and (iii) a third pixel block having a third pixel
   including a third photoelectric converter that converts
   light into an electric charge, the first pixel block, the
   second pixel block, and the third pixel block being
   arranged in a column direction;
a second substrate including (i) a first signal processing
   block having a first signal converter, which converts
   into a digital signal a first signal that is based on the
   electric charge converted by the first photoelectric
   converter, and a first pixel drive unit that outputs a first
   control signal for controlling an accumulation time
   during which the electric charge converted by the first
   photoelectric converter is accumulated, (ii) a second
   signal processing block having a second signal con-
   verter, which converts into a digital signal a second
   signal that is based on the electric charge converted by
   the second photoelectric converter, and a second pixel
   drive unit that outputs a second control signal for
   controlling an accumulation time during which the
   electric charge converted by the second photoelectric
   converter is accumulated, and (iii) a third signal pro-
   cessing block having a third signal converter, which
   converts into a digital signal a third signal that is based
   on the electric charge converted by the third photoelec-
   tric converter, and a third pixel drive unit that outputs
   a third control signal for controlling an accumulation
   time during which the electric charge converted by the
   third photoelectric converter is accumulated, the sec-
   ond substrate being a substrate that is stacked together
   with the first substrate;
a first joint to which the first signal is output, the first joint
   being for electrically connecting the first substrate and
   the second substrate;
a second joint to which the second signal is output, the
   second joint being for electrically connecting the first
   substrate and the second substrate;
a third joint to which the third signal is output, the third
   joint being for electrically connecting the first substrate
   and the second substrate;
a fourth joint to which the first control signal is output, the
   fourth joint being for electrically connecting the first
   substrate and the second substrate;
a fifth joint to which the second control signal is output,
   the fifth joint being for electrically connecting the first
   substrate and the second substrate; and a sixth joint to which the third control signal is output, the
   sixth joint being for electrically connecting the first
   substrate and the second substrate,
wherein the second pixel block is provided between the
   first pixel block and the third pixel block in the column
   direction, and
wherein an interval between the first joint and the second
   joint is smaller than an interval between the second
   joint and the third joint.
2. The imaging element according to claim 1, further
comprising:
a wiring layer including (i) a first signal line electrically
   connected to the first pixel, to which the first signal read
   from the first pixel is output, (ii) a second signal line
   electrically connected to the second pixel, to which the
   second signal read from the second pixel is output, and
   (iii) a third signal line electrically connected to the third
   pixel, to which the third signal read from the third pixel
   is output,
wherein the wiring layer is arranged between the first
   substrate and the second substrate in a stacking direc-
   tion in which the first substrate and the second substrate
   are stacked.
3. The imaging element according to claim 2,
wherein the first joint is electrically connected to the first
   signal line,
wherein the second joint is electrically connected to the
   second signal line, and
wherein the third joint is electrically connected to the
   third signal line.
4. The imaging element according to claim 1,
wherein the first signal processing block is arranged at a
   position opposite to the first pixel block in a stacking
   direction in which the first substrate and the second
   substrate are stacked,
wherein the second signal processing block is arranged at
   a position opposite to the second pixel block in the
   stacking direction, and
wherein the third signal processing block is arranged at a
   position opposite to the third pixel block in the stacking
   direction.
5. The imaging element according to claim 4, further
comprising:
a wiring layer including (i) a first signal line electrically
   connected to the first pixel, to which the first signal read
   from the first pixel is output, (ii) a second signal line
   electrically connected to the second pixel, to which the
   second signal read from the second pixel is output, and
   (iii) a third signal line electrically connected to the third
   pixel, to which the third signal read from the third pixel
   is output,
wherein the wiring layer is arranged between the first
   substrate and the second substrate in the stacking
   direction in which the first substrate and the second
   substrate are stacked.
6. The imaging element according to claim 5,
wherein the first joint is electrically connected to the first
   signal line,
wherein the second joint is electrically connected to the
   second signal line, and
wherein the third joint is electrically connected to the
   third signal line.
7. The imaging element according to claim 1, further
comprising a seventh joint to which a reference potential supplied to the first signal processing block is output, the seventh joint electrically connecting the first substrate and the second substrate.

8. The imaging element according to claim 7, wherein a reference potential supplied to the second signal processing block is output to the seventh joint.

9. The imaging element according to claim 1, wherein the first joint, the second joint, the third joint, the fourth joint, the fifth joint, and the sixth joint each have a conductive pad, the conductive pads being arranged to face each other in a stacking direction in which the first substrate and the second substrate are stacked.

10. The imaging element according to claim 1, wherein the first pixel block includes a fourth pixel having a fourth photoelectric converter arranged in line with the first photoelectric converter in a row direction, the fourth photoelectric converter being a photoelectric converter that converts light into an electric charge; wherein the second pixel block includes a fifth pixel having a fifth photoelectric converter arranged in line with the second photoelectric converter in the row direction, the fifth photoelectric converter being a photoelectric converter that converts light into an electric charge; wherein the third pixel block includes a sixth pixel having a sixth photoelectric converter arranged in line with the third photoelectric converter in the row direction, the sixth photoelectric converter being a photoelectric converter that converts light into an electric charge; wherein the first signal processing block includes a fourth signal converter that converts into a digital signal a fourth signal that is based on the electric charge converted by the fourth photoelectric converter; wherein the second signal processing block includes a fifth signal converter that converts into a digital signal a fifth signal that is based on the electric charge converted by the fifth photoelectric converter; and wherein the third signal processing block includes a sixth signal converter that converts into a digital signal a sixth signal that is based on the electric charge converted by the sixth photoelectric converter.

11. The imaging element according to claim 10, wherein the fourth signal converter is arranged in line with the first signal converter in the row direction, wherein the fifth signal converter is arranged in line with the second signal converter in the row direction, and wherein the sixth signal converter is arranged in line with the third signal converter in the row direction.

12. The imaging element according to claim 10, wherein the first pixel drive unit controls an accumulation time during which the electric charge converted by the fourth photoelectric converter is accumulated, wherein the second pixel drive unit controls an accumulation time during which the electric charge converted by the fifth photoelectric converter is accumulated, and wherein the third pixel drive unit controls an accumulation time during which the electric charge converted by the sixth photoelectric converter is accumulated.

13. The imaging element according to claim 10, wherein the first pixel block includes a seventh pixel including a seventh photoelectric converter arranged in line with the first photoelectric converter in the column direction, the seventh photoelectric converter being a photoelectric converter that converts light into an electric charge;

wherein the second pixel block includes an eighth pixel including an eighth photoelectric converter arranged in line with the second photoelectric converter in the column direction, the eighth photoelectric converter being a photoelectric converter that converts light into an electric charge; wherein the third pixel block includes a ninth pixel including a ninth photoelectric converter arranged in line with the third photoelectric converter in the column direction, the ninth photoelectric converter being a photoelectric converter that converts light into an electric charge; wherein the first signal converter converts into a digital signal a seventh signal that is based on the electric charge converted by the seventh photoelectric converter; wherein the second signal converter converts into a digital signal an eighth signal that is based on the electric charge converted by the eighth photoelectric converter; and wherein the third signal converter converts into a digital signal a ninth signal that is based on the electric charge converted by the ninth photoelectric converter.

14. The imaging element according to claim 13, wherein the first pixel drive unit controls an accumulation time during which the electric charge converted by the fourth photoelectric converter is accumulated and controls an accumulation time during which the electric charge converted by the seventh photoelectric converter is accumulated, wherein the second pixel drive unit controls an accumulation time during which the electric charge converted by the fifth photoelectric converter is accumulated and controls an accumulation time during which the electric charge converted by the eighth photoelectric converter is accumulated, and wherein the third pixel drive unit controls an accumulation time during which the electric charge converted by the sixth photoelectric converter is accumulated and controls an accumulation time during which the electric charge converted by the ninth photoelectric converter is accumulated.

15. The imaging element according to claim 1, wherein the first pixel block includes a fourth pixel including a fourth photoelectric converter arranged in line with the first photoelectric converter in the column direction, the fourth photoelectric converter being a photoelectric converter that converts light into an electric charge; wherein the second pixel block includes a fifth pixel including a fifth photoelectric converter arranged in line with the second photoelectric converter in the column direction, the fifth photoelectric converter being a photoelectric converter that converts light into an electric charge; wherein the third pixel block includes a sixth pixel including a sixth photoelectric converter arranged in line with the third photoelectric converter in the column direction, the sixth photoelectric converter being a photoelectric converter that converts light into an electric charge; wherein the first signal converter converts into a digital signal a fourth signal that is based on the electric charge converted by the fourth photoelectric converter; wherein the second signal converter converts into a digital signal a fifth signal that is based on the electric charge converted by the fifth photoelectric converter; and

wherein the third signal converter converts into a digital
signal a sixth signal that is based on the electric charge
converted by the sixth photoelectric converter.

16. The imaging element according to claim 15,
wherein the first pixel drive unit controls an accumulation
time during which the electric charge converted by the
fourth photoelectric converter is accumulated,
wherein the second pixel drive unit controls an accumu-
lation time during which the electric charge converted
by the fifth photoelectric converter is accumulated, and
wherein the third pixel drive unit controls an accumula-
tion time during which the electric charge converted by
the sixth photoelectric converter is accumulated.

17. An imaging device comprising the imaging element
according to claim 1.

18. The imaging device according to claim 17, further
comprising
an image processing unit that is electrically connected to
the imaging element and performs image processing.

19. The imaging device according to claim 17, further
comprising
a drive unit that controls an optical system that emits light
onto the imaging element.

20. The imaging device according to claim 19, further
comprising
the optical system.

\* \* \* \* \*

28